United States Patent
Zhou et al.

(10) Patent No.: US 10,187,731 B2
(45) Date of Patent: Jan. 22, 2019

(54) MAGNETORESISTIVE AUDIO PICKUP

(71) Applicant: MultiDimension Technology Co., Ltd., Zhangjiagang (CN)

(72) Inventors: Zhimin Zhou, Zhangjiagang (CN); James Geza Deak, Zhangjiagang (CN); Haiping Guo, Zhangjiagang (CN)

(73) Assignee: MultiDimension Technology Co., Ltd., Zhangjiagang, Jiangsu (CN)

( * ) Notice: Subject to any disclaimer, the term of this patent is extended or adjusted under 35 U.S.C. 154(b) by 0 days.

(21) Appl. No.: 15/127,663

(22) PCT Filed: Mar. 19, 2015

(86) PCT No.: PCT/CN2015/074556
§ 371 (c)(1),
(2) Date: Sep. 20, 2016

(87) PCT Pub. No.: WO2015/139643
PCT Pub. Date: Sep. 24, 2015

(65) Prior Publication Data
US 2017/0374472 A1     Dec. 28, 2017

(30) Foreign Application Priority Data

Mar. 20, 2014    (CN) .......................... 2014 1 0106348

(51) Int. Cl.
*H04R 29/00*     (2006.01)
*H04R 15/00*     (2006.01)
(Continued)

(52) U.S. Cl.
CPC ............. *H04R 15/00* (2013.01); *G01R 33/09* (2013.01); *G01R 33/091* (2013.01);
(Continued)

(58) Field of Classification Search
CPC ...... H04R 15/00; H04R 29/00; H04R 29/001; H04R 29/002; H04R 29/003;
(Continued)

(56) References Cited

U.S. PATENT DOCUMENTS

| | | | |
|---|---|---|---|
| 5,450,372 A * | 9/1995 | Jin .......................... | G01H 11/02 181/148 |
| 5,553,152 A * | 9/1996 | Newton ............... | H04R 25/558 381/328 |

(Continued)

FOREIGN PATENT DOCUMENTS

| | | |
|---|---|---|
| CN | 101562672 | 10/2009 |
| CN | 101663902 | 3/2010 |

(Continued)

OTHER PUBLICATIONS

"International Application No. PCT/CN2015/074556, International Search Report and Written Opinion dated Jun. 17, 2015", (Jun. 17, 2015), 9 pgs.

*Primary Examiner* — Leshui Zhang
(74) *Attorney, Agent, or Firm* — Schwegman, Lundberg & Woessner, P.A.

(57) ABSTRACT

A magnetoresistive audio pickup comprises an audio detection circuit. The audio detection circuit comprises at least one linear magnetoresistive sensor, a coupling capacitance, an AC amplifier, and a signal processing circuit comprising an additional amplifier. The linear magnetoresistive sensor comprises at least one single-axis linear magnetoresistive sensor unit. The linear magnetoresistive sensors are placed in a measurement plane above a speaker's voice coil, the signal output end of each single-axis linear magnetoresistive sensor unit is capacitively coupled to the AC amplifier which provides AC signals through electrical connection to the amplifier, these signals are combined within the signal processing unit into an audio signal, and the audio signal is (Continued)

output from the circuit; each single-axis linear sensor unit is located in the linear response area of the measurement plane. The present invention detects a speaker's audio signals via magnetic field coupling between a speaker and a linear magnetoresistive sensor. The magnetoresistive audio pick-up's structure is simple and it also provides low power consumption.

19 Claims, 30 Drawing Sheets

(51) Int. Cl.
    *H04R 23/00*     (2006.01)
    *G01R 33/09*     (2006.01)
    *H04B 5/00*     (2006.01)

(52) U.S. Cl.
    CPC ........... *H04B 5/0031* (2013.01); *H04R 23/00* (2013.01); *H04R 29/001* (2013.01); *H04R 2499/11* (2013.01); *Y02D 70/00* (2018.01); *Y02D 70/122* (2018.01); *Y02D 70/166* (2018.01); *Y02D 70/42* (2018.01)

(58) Field of Classification Search
    CPC ........................... H04R 29/007; H04R 29/008; H04R 2499/11; H04R 9/06; H04R 23/00; G01R 33/09; G01R 33/091; G01R 33/10; G01R 33/12; G01R 33/0029; G01R 33/06; H04M 11/02; G10B 7/023; G01D 5/145
    USPC .......... 381/56, 57, 58, 59, 60, 190; 324/244, 324/252
See application file for complete search history.

(56) References Cited

U.S. PATENT DOCUMENTS

| | | | | |
|---|---|---|---|---|
| 5,638,304 | A * | 6/1997 | Billoud | F16F 15/002 381/71.11 |
| 5,659,621 | A * | 8/1997 | Newton | H04R 25/558 381/312 |
| 5,747,986 | A * | 5/1998 | Hristoforou | G01D 5/485 178/18.07 |
| 6,134,060 | A * | 10/2000 | Ryat | G01R 33/09 360/46 |
| 7,646,876 | B2 * | 1/2010 | Chu | H04N 7/142 348/14.01 |
| 8,259,986 | B2 * | 9/2012 | Danovi | H04R 9/025 381/397 |
| 9,182,457 | B2 * | 11/2015 | Deak | G01R 31/025 |
| 2007/0121249 | A1 * | 5/2007 | Parker | G01R 33/04 360/123.1 |
| 2009/0140726 | A1 * | 6/2009 | Janke | G01R 33/07 324/207.13 |
| 2010/0033175 | A1 * | 2/2010 | Boeve | B82Y 25/00 324/252 |
| 2010/0142738 | A1 * | 6/2010 | Zhang | H04R 25/558 381/315 |
| 2013/0343588 | A1 * | 12/2013 | Karunasiri | A61N 1/375 381/332 |

FOREIGN PATENT DOCUMENTS

| | | |
|---|---|---|
| CN | 101855563 | 10/2010 |
| CN | 104219613 | 12/2014 |
| CN | 204046820 | 12/2014 |
| WO | WO-2015139643 | 9/2015 |

* cited by examiner

| Input | Output | | | | |
|---|---|---|---|---|---|
| 1209 | 1219 | 1221 | 1227 | 1223 | 1229 |
| 0 | 1 | | | 0 | |
| 1 | 0 | | | 1 | |

Fig. 63

| Input | | Output | | | | | | | |
|---|---|---|---|---|---|---|---|---|---|
| 1518 | 1519 | 1501 | 1502 | 1503 | 1506 | 1504 | 1505 | 1507 | 1509 |
| 0 | 0 | 1 | 1 | 0 | 0 | | 0 | | 0 |
| 0 | 1 | 0 | 1 | 1 | 0 | | 0 | | 1 |
| 1 | 0 | 1 | 0 | 0 | 1 | | 1 | | 1 |
| 1 | 1 | 0 | 0 | 1 | 1 | | 1 | | 1 |

Fig. 64

| Input | | | Output | | | | | | | | | | |
|---|---|---|---|---|---|---|---|---|---|---|---|---|---|
| 813 | 812 | 811 | 701 | 702 | 703 | 704 | 708 | 705 | 708 | 706 | 707 | 710 | 711 |
| 0 | 0 | 0 | 1 | 1 | 1 | 0 | 0 | 0 | 0 | | | | |
| 0 | 0 | 1 | 0 | 1 | 1 | 1 | 0 | 0 | 1 | | | | |
| 0 | 1 | 0 | 1 | 0 | 1 | 0 | 1 | 0 | 1 | | | | |
| 1 | 0 | 0 | 1 | 1 | 0 | 0 | 0 | 1 | 1 | | | | |
| 0 | 1 | 1 | 0 | 0 | 1 | 1 | 1 | 0 | 1 | | | | |
| 1 | 0 | 1 | 0 | 1 | 0 | 1 | 0 | 1 | 1 | | | | |
| 1 | 1 | 0 | 1 | 0 | 0 | 0 | 1 | 1 | 1 | | | | |
| 1 | 1 | 1 | 0 | 0 | 0 | 1 | 1 | 1 | 1 | | | | |

Fig. 65

MAGNETORESISTIVE AUDIO PICKUP

PRIORITY CLAIM TO RELATED APPLICATIONS

This application is a U.S. national stage application filed under 35 U.S.C. § 371 from International Application Serial No. PCT/CN2015/074556, which was filed 19 Mar. 2015, and published as WO2015/139643 on 24 Sep. 2015, and which claims priority to Chinese Application No. 201410106348.9, filed 20 Mar. 2014, which applications and publication are incorporated by reference as if reproduced herein and made a part hereof in their entirety, and the benefit of priority of each of which is claimed herein.

TECHNICAL FIELD

The present invention relates to the field of magnetic sensor technologies, and in particular, to a magnetoresistive audio pickup.

BACKGROUND ART

An audio pickup is a device that picks up audio electromagnetic signals of a speaker on a smartphone, a tablet computer or other smart electronic devices via a sensor, and plays on another speaker.

At present, a coil or transformer type audio pickup is mainly employed. That is, a voice coil of a speaker is used as a primary coil of audio electromagnetic field transmitting signals, a receiving coil is used as a secondary coil to receive audio electromagnetic signals in the voice coil through the electromagnetic induction effect, of which the principle is similar to that of the transformer, and then the received signals are reconverted to sound signals in another speaker via a signal processing circuit. In this way, an audio play function of wireless connection is achieved between the speaker and the audio pickup. Such a coil-type audio pickup has the following problems:

1) The amplitude of the voltage output by the receiving coil is related to the number of turns and the area of the coil, and thus, only by increasing the number of turns and the area of the coil can a large receiving voltage signal and high sensitivity be obtained; as a result, the volume and the size are larger.

2) The electromagnetic field signals generated by the voice coil of the speaker are mainly surround spatial regions near the voice coil and attenuate quickly with the increase of the distance, and thus the receiving coil has to be located in regions near the voice coil as much as possible; as a result, the spatial flexibility of the coil is reduced.

SUMMARY OF THE INVENTION

An objective of the present invention is to provide a magnetoresistive audio pickup for solving the problems such as a great volume of the existing audio pickup.

To this end, the present invention provides a magnetoresistive audio pickup for converting an electromagnetic signal of a speaker to an audio signal, the speaker having a measurement plane above a voice coil surface, and the measurement plane having an single-axis working area; the single component working area being an intersection formed by a linear magnetic field measurement area, an alternating current (AC) magnetic field measurement area and a signal-to-noise ratio (SNR) measurement area of the measurement plane, wherein the magnetoresistive audio pickup includes an audio pickup circuit including at least one linear magnetoresistive sensor, a coupling capacitor, an AC amplifier, an amplifier and a signal processing circuit; the linear magnetoresistive sensor includes at least one single-axis linear magnetoresistive sensor unit sensing signals from the linear magnetic field measurement area. Each of the single-axis linear magnetoresistive sensor units has a power input end and a signal output end separately, the signal output end of each of the single-axis linear magnetoresistive sensor units is connected to the AC amplifier via the coupling capacitor, respectively, to output AC signals, and then is connected to the amplifier to combine the signals into one signal, which is then output as an audio signal via the signal processing circuit.

Preferably, the magnetoresistive audio pickup according to the present invention further includes a linear magnetic field measurement area control circuit for detecting whether each of the single-axis linear magnetoresistive sensor units is located on the measurement plane or not, the control circuit being a magnetic switch type control circuit or a direct current (DC) output type control circuit or both.

The magnetic switch type control circuit includes a magnetic switch sensor having at least one single-axis magnetic switch sensor unit, a comparator and a controller, the single-axis magnetic switch sensor units and the detected single-axis linear magnetoresistive sensor units have the same directions of sensitive axes for detecting magnetic fields of the directions of sensitive axes on the measurement plane, a signal output end of the single-axis magnetic switch sensor unit is connected to the comparator, and the comparator compares a signal of the single-axis linear magnetoresistive sensor unit detected by the single-axis magnetic switch sensor unit with a reference voltage stored by the comparator to obtain a comparison signal, and inputs the comparison signal into the controller, in order that the controller controls the audio pickup circuit according to the comparison signal; the DC output type control circuit includes a filter, a prepositive/differential amplifier, a comparator and a controller, the signal output end of each of the detected single-axis linear magnetoresistive sensor units is connected to the amplifier via the filter to obtain a DC output signal, the DC output signal is compared with the reference voltage of the comparator to obtain a comparison signal, and the comparator inputs the comparison signal into the controller, in order that the controller controls the audio pickup circuit according to the comparison signal.

The magnetic switch sensor is a combination of discrete elements of at least two single-axis magnetic switch sensor units or a single chip element integrating at least two single-axis magnetic switch sensor units.

Each of the single-axis magnetic switch sensor units is an X-, Y- or Z-axis magnetic switch sensor.

Each of the single-axis switch sensor units is an all-pole type magnetic switch sensor.

The single-axis linear magnetoresistive sensor unit is a half-bridge structure, and the signal output end of the single-axis linear magnetoresistive sensor unit is connected to the prepositive amplifier via the filter;

or the single-axis linear magnetoresistive sensor unit is a full-bridge structure, and two signal output ends of the single-axis linear magnetoresistive sensor unit are connected to the differential amplifier via the filter, respectively.

Upper and lower limits of linear magnetic fields and upper and lower limits of saturation magnetic fields of each of the single-axis linear magnetoresistive sensor units are values of operating magnetic fields and restoring magnetic fields of each of the single-axis switch sensor units or reference signals of a comparator of a DC voltage type control circuit.

The control circuit is further used for outputting multiple control signals to respectively control the detected single-axis linear magnetoresistive sensor unit to switch to DC power supply or pulsed power supply, and to turn on or turn off any one or more of the power of the AC amplifier, the power of the amplifier, the power of the signal processing circuit and magnetically labeled signals.

The linear magnetoresistive sensor is a combination of discrete elements of at least two single-axis linear magnetoresistive sensor units or a single chip element integrating at least two single-axis linear magnetoresistive sensor units.

Each of the single-axis linear magnetoresistive sensor units is an X-, Y- or Z-axis sensor.

The single-axis linear magnetoresistive sensor unit is a half-bridge structure, and the signal output end of the single-axis linear magnetoresistive sensor unit is connected to a prepositive AC amplifier via the coupling capacitor; or the single-axis linear magnetoresistive sensor unit is a full-bridge structure, and two signal output ends of the single-axis linear magnetoresistive sensor unit are connected to a differential AC amplifier via the coupling capacitor, respectively.

At least one single-axis linear magnetoresistive sensor, two-axis and three-axis linear magnetoresistive sensors are each located in an intersection or union of single-axis working areas of each of the corresponding single-axis linear magnetoresistive sensor units respectively.

The linear magnetoresistive sensor is one of AMR, Hall, GMR and TMR sensor.

The measurement plane is at a distance in a range of 0 mm to 10 mm from the voice coil surface of the speaker.

The directions of sensitive axes of the single-axis linear magnetoresistive sensor units are perpendicular to or parallel to the measurement plane.

The linear magnetoresistive sensor is located on a measurement plane parallel to the voice coil surface of the speaker, and at least one of the single-axis linear magnetoresistive sensor units is located in a linear magnetic field measurement area on the measurement plane.

Each of the single-axis linear magnetoresistive sensor units is located in the corresponding single component working area on the measurement plane; on the measurement plane, a linear magnetic field measurement area, a non-linear magnetic field measurement area and a saturation magnetic field measurement area of an DC magnetic field of a permanent magnetic circuit correspond to a linear magnetic field characteristic area, a non-linear magnetic field characteristic area and a saturation magnetic field characteristic area of each of the single-axis linear magnetoresistive sensor units, respectively; on the measurement plane, regions in which amplitudes of various AC magnetic field components produced by the voice coil of the speaker are greater than 1 mG are AC magnetic field measurement areas, and regions in which the amplitudes are less than 1 mG are AC magnetic field non-measurement areas; on the measurement plane, when a frequency band is 15 kHz, regions in which SNRs of AC audio signals output by each of the single-axis linear magnetoresistive sensor units to thermal noise are greater than 1 are SNR measurement areas, and regions in which the SNRs are less than 1 are SNR non-measurement areas.

The audio pickup is suitable for speakers having circular, racetrack-shaped or rectangular voice coils.

The audio pickup is suitable for external magnetic or internal magnetic speakers.

The magnetoresistive audio pickup provided in the present invention uses a high-sensitivity linear magnetoresistive sensor to directly convert AC electromagnetic field signals of a voice coil to AC voltage signals for output, which successfully solves the above shortcomings. The linear magnetoresistive sensor only responds to magnetic field signals at the location thereof, the spatial position occupied by it only depends on the size of the linear magnetoresistive sensor itself, and the size of the linear magnetoresistive sensor is much less than that of a pickup coil; therefore, the linear magnetoresistive sensor pickup will have a greater measureable range and a greater spatial flexibility, and its mounting size required will also be reduced greatly; in addition, as the linear magnetoresistive sensor has higher magnetic field sensitivity, an output voltage signal greater than that of the pickup coil can be obtained.

BRIEF DESCRIPTION OF THE DRAWINGS

FIGS. 63-65 are respectively tables of logic control signals of audio pickup systems of single-axis, two-axis and three-axis linear magnetoresistive sensors.

DETAILED DESCRIPTION OF THE PREFERRED EMBODIMENTS

The present invention is described below in detail with reference to the drawings and embodiments.

Embodiment 1

Figure 1:
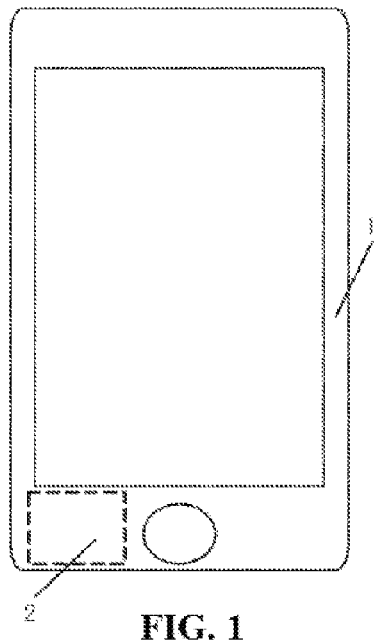
FIG. 1 is a schematic view of positions of a smartphone and a speaker of the smartphone.
Figure 2:
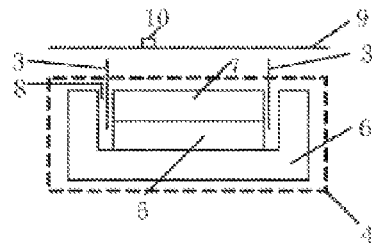
FIG. 2 is a two-dimensional schematic structural view of an internal magnetic speaker.
Figure 3:
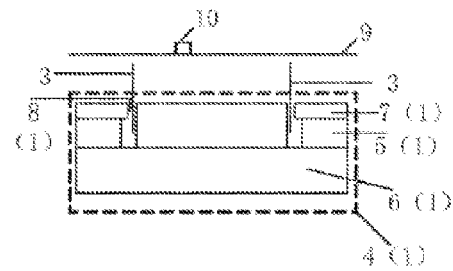
FIG. 3 is a two-dimensional schematic structural view of an external magnetic speaker.
Figure 4:
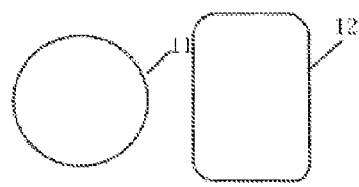
FIG. 4 is a schematic view of a geometrical shape of a voice coil of a speaker.

FIG. 1 is a schematic view of the position of a speaker in a smart electronic device, such as a smartphone; the speaker 2 is located in a position below the screen of the smartphone 1. FIG. 2 and FIG. 3 are structural views of the speaker, the speaker includes two parts: a permanent magnetic circuit 4 or 4(1) and a voice coil 3, the permanent magnetic circuit 4 or 4(1) includes a permanent magnet 5 or 5(1) and soft magnets 6 or 6(1) and 7 or 7(1) and an air gap 8 or 8(1), and the voice coil 3 is located at the air gap 8 or 8(1); as the permanent magnetic circuit 4 or 4(1) produces a strong static magnetic field in the air gap 8 or 8(1), when an audio AC signal passes through the voice coil 3, the voice coil 3 produces Lorentz force under the action of the static magnetic field in the air gap 8 or 8(1) to drive a vibrating diaphragm to sound. According to different arrangements of the permanent magnet 5 or 5(1) and the soft magnets 6 or 6(1) and 7 or 7(1) in the permanent magnetic circuit 4 or 4(1), the speaker 2 may be divided into an internal magnetic type and an external magnetic type, for the former, as in FIG. 2, the permanent magnet 5 is located inside the voice coil 3, and for the latter, as in FIG. 3, the permanent magnet 5(1) is located on the periphery of the voice coil 3. The voice coil 3 and the permanent magnetic circuit 4 or 4(1) have similar geometrical shapes, which are generally the rectangle 12 or the circle 11 as shown in FIG. 4. Therefore, the speaker 2 may be divided into four typical structures: an external magnetic circle, an external magnetic rectangle, an internal magnetic circle and an internal magnetic rectangle, according to different geometrical shapes and types of permanent magnetic circuits.

The linear magnetoresistive sensor 10 in FIG. 2 and FIG. 3 is placed on a measurement plane 9 parallel to surfaces of the voice coil 3 and the permanent magnetic circuit 4.

Preferably, the measurement plane is located at a distance in a range of 0 mm to 10 mm from a voice coil surface of the speaker.

Embodiment 2

Magnetic fields of the speaker 2 include two parts, that is, DC static magnetic fields from the permanent magnetic circuit 4 or 4(1) and AC audio magnetic fields from the voice coil 3. Therefore, for the linear magnetoresistive sensor 10 placed on the measurement plane 9, a biased DC static magnetic field H is present, and under this condition, measurement on an AC audio magnetic field h is implemented, wherein, for a mobile phone's speaker, the amplitude of H is much greater than that of h.

Figure 5:
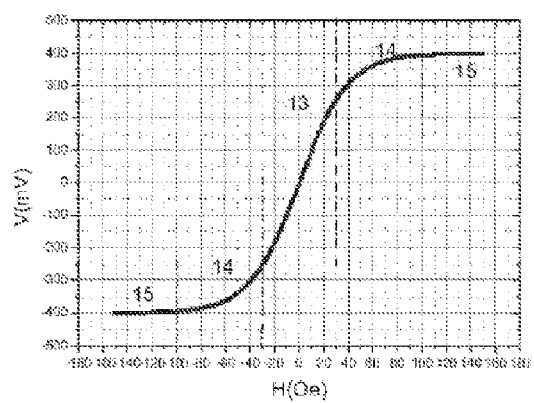
FIG. 5 is a characteristic curve of output voltage vs. external magnetic field of a linear magnetoresistive sensor.
Figure 6:
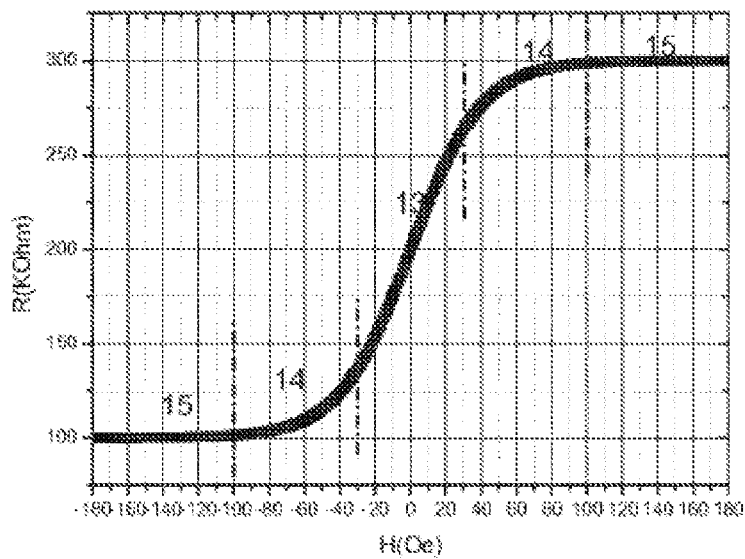
FIG. 6 is a characteristic curve of output resistance vs. external magnetic field of the linear magnetoresistive sensor.

FIG. 5 and FIG. 6 are respectively characteristic curves of resistance vs. magnetic field and output signal voltage vs. magnetic field of the linear magnetoresistive sensor 10, from which it can be seen that the linear magnetoresistive sensor 10 has three characteristic areas in the whole magnetic field range, that is, a linear magnetic field characteristic area 13, a non-linear magnetic field characteristic area 14 and a saturation magnetic field characteristic area 15, and only when the DC static magnetic field H is in the linear magnetic field characteristic area 13 can an AC audio magnetic field signal h be correctly converted to a voltage signal of the linear magnetoresistive sensor 10. Corresponding to the measurement plane 9, the DC static magnetic field H thereon may also be divided into three magnetic field measurement areas, that is, a linear magnetic field measurement area, a non-linear magnetic field measurement area and a saturation magnetic field measurement area.

In addition, for the linear magnetoresistive sensor 10, only by requiring the amplitude of the AC audio magnetic field h to be greater than 1 mG can measurement requirements be met; for smaller magnetic fields, in the presence of resolution and noise, it is difficult to implement measurements, and no signal will be output at this point.

On this basis, distributions of DC output signals and audio output signal voltages of the linear magnetoresistive sensor 10 in the linear magnetic field measurement area are determined respectively according to the characteristic curve of output signal voltage vs. magnetic field of the linear magnetoresistive sensor 10 and distribution values of the DC static magnetic field H and the AC audio magnetic field h on the measurement plane 9 in the three magnetic field measurement areas. Further, in order to determine distributions of ratios of audio output signals of the linear magnetoresistive sensor 10 to Johnson thermal noise, distributions of Johnson noise voltages in the three magnetic field measurement areas are determined according to the curve of resistance vs. magnetic field of the linear magnetoresistive sensor 10 and spatial distribution of the DC static magnetic field H, and ratios of the distributions to distribution values of the audio output signal voltages are calculated.

Figure 7:
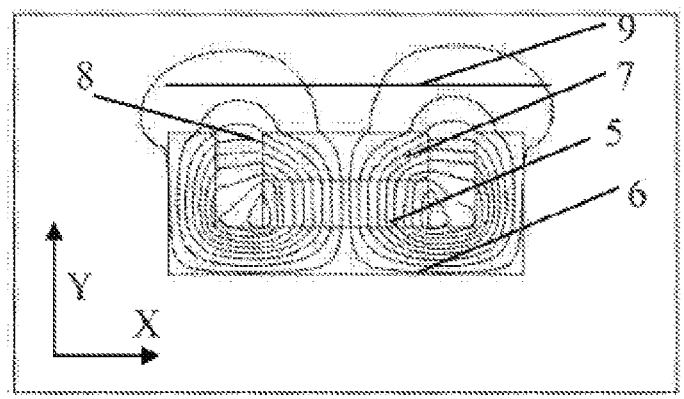
FIG. 7 is a distribution plot of two-dimensional magnetic force lines of DC magnetic fields of an internal magnetic speaker.
Figure 8:
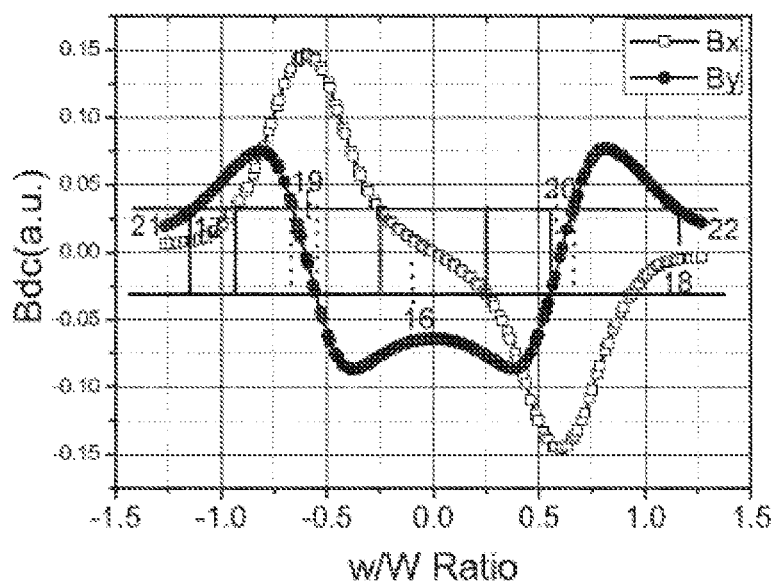
FIG. 8 is a distribution plot of two-dimensional DC magnetic fields on a measurement plane of the internal magnetic speaker.

FIG. 7 is a distribution plot of two-dimensional DC magnetic fields of a permanent magnetic circuit 4 of an internal magnetic speaker, from which it can be seen that magnetic force lines have axisymmetric characteristics, and start from the permanent magnet 7, cross the air gap 8 and pass through the soft magnets 6 and 5 to return to the permanent magnet 7. FIG. 8 is a distribution plot of two-dimensional DC static magnetic fields, that is, magnetic fields Bx and By, on the measurement plane 9 above the internal magnetic circuit 4 along an X direction, from which it can be seen that Bx has antisymmetric distribution characteristics relative to the magnetic field 0 in the center, while By has symmetric distribution characteristics relative to the center. In addition, from the distribution of the linear magnetic field characteristic area 13 of the linear magnetoresistive sensor 10, there are three linear magnetic field measurement areas for Bx, that is, a region 16 near the magnetic field 0 in the center and two magnetic field attenuation regions 17 and 18 located on two ends. There are four linear magnetic field measurement areas for By, that is, regions 19 and 20 near two magnetic fields 0 on the left and the right and magnetic field attenuation regions 21 and 22 on two ends; the magnetic field attenuation regions are caused by cubic attenuation with the increase of the distance occurring when a magnetic field is away from a magnet.

Figure 9:
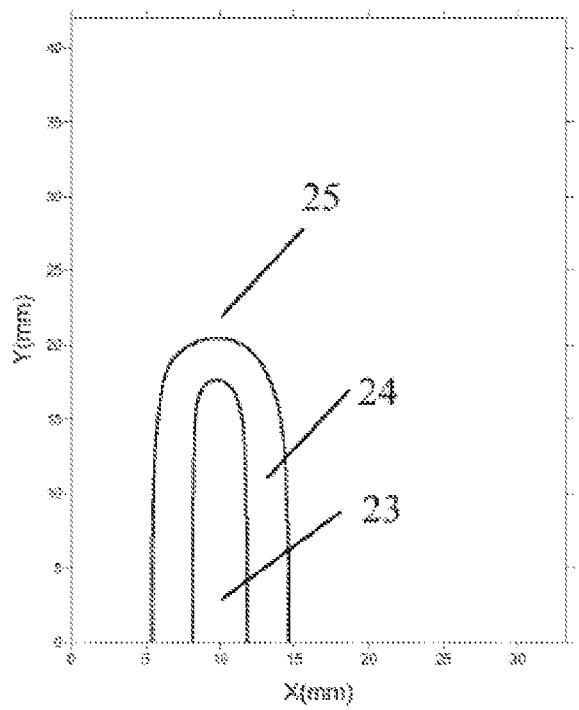
FIGS. 9-11 are respectively profiles of measurement areas of DC magnetic fields Bx, By and Bz on a measurement plane of an internal magnetic rectangular speaker.
Figure 10:
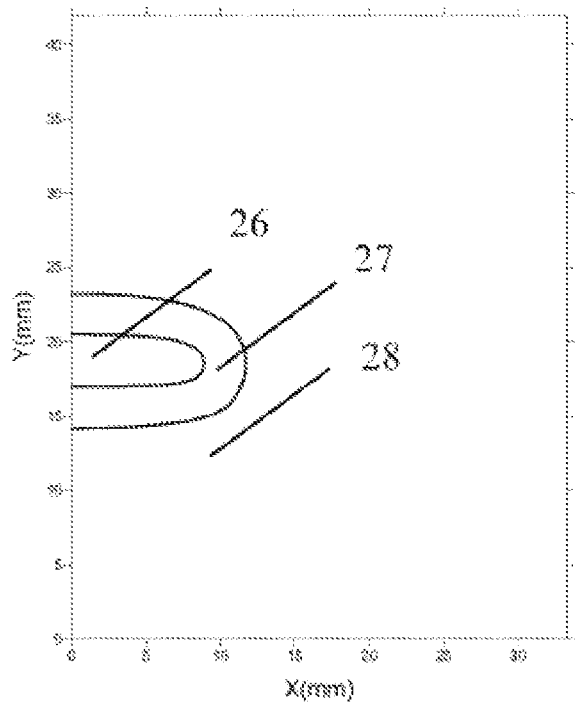
Figure 11:
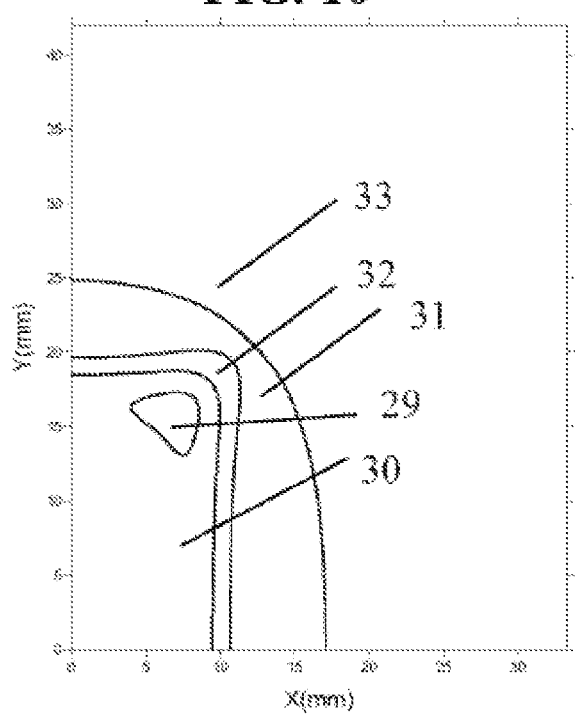

FIGS. 9, 10 and 11 are respectively distribution plots of isoline regions of three-dimensional magnetic fields Bx, By and Bz on a measurement plane 9 of a rectangular internal magnetic speaker, wherein two marked isolines represent magnetic field limit values between a linear magnetic field characteristic area 13 and a non-linear magnetic field characteristic area 14 and between the non-linear magnetic field characteristic area 14 and a saturation magnetic field characteristic area 15 respectively; only a quarter of the distribution plots of isolines of the magnetic fields are drawn due to axisymmetric characteristics of X and Y axes. A saturation magnetic field measurement area 23, a non-linear magnetic field measurement area 24 and a saturation magnetic field measurement area 25 of Bx and a saturation magnetic field measurement area 26, a non-linear magnetic field measurement area 27 and a saturation magnetic field measurement area 28 of By on the measurement plane 9 can be seen, and it can be seen in combination with the distribution plot of the two-dimensional magnetic field Bx that three regions corresponding to the two-dimensional linear magnetic field measurement areas 16, 17 and 18 shown in FIG. 8 are actually connected into a region 25 or 28 on the measurement plane 9. In addition, it can be seen that, in the distribution plots of three-dimensional isoline regions, Bx in FIG. 9 and By in FIG. 10 have similar isoline distribution characteristics, but their phases rotate 90 degrees relatively. For Bz in FIG. 11, it has two linear magnetic field measurement areas, one 32 is located at an edge of the voice coil 3 and the other one 33 is located outside the voice coil, of which the saturation area 29 only occupies a small part and located at a corner of the voice coil, other regions, for example, 30 and 31, are non-linear magnetic field measurement areas, and compared with FIG. 8, the two-dimensional linear magnetic field measurement areas 19 and 20 are the three-dimensional linear magnetic field measurement area 32, and 21 and 22 are 33.

Figure 12:
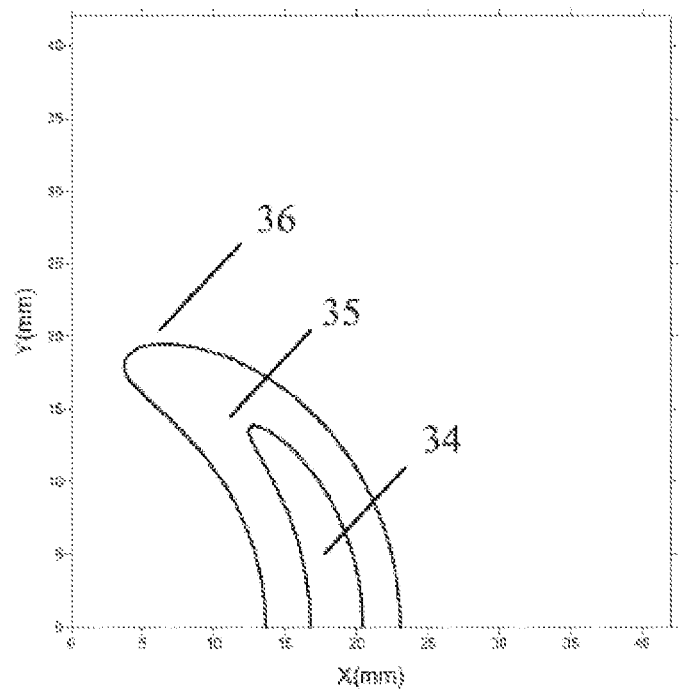
FIGS. 12-14 are respectively profiles of measurement areas of DC magnetic fields Bx, By and Bz on a measurement plane of an internal magnetic circular speaker.
Figure 13:
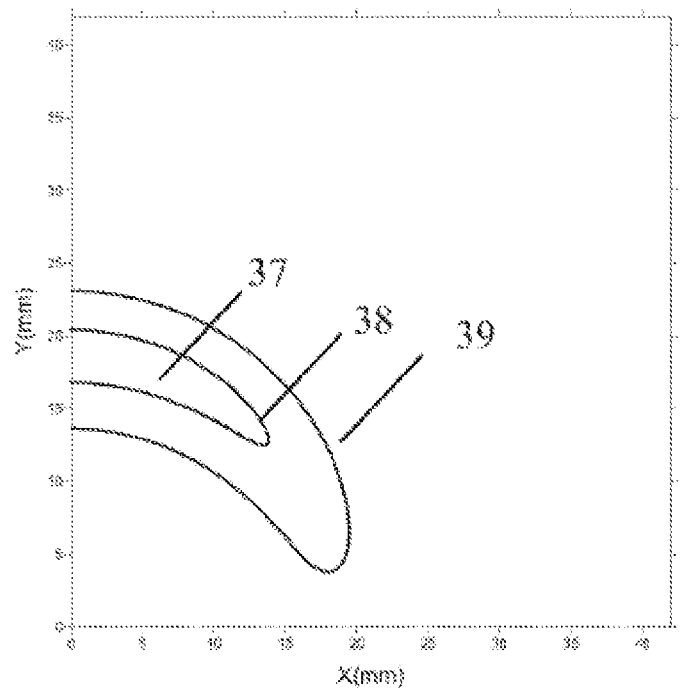
Figure 14:
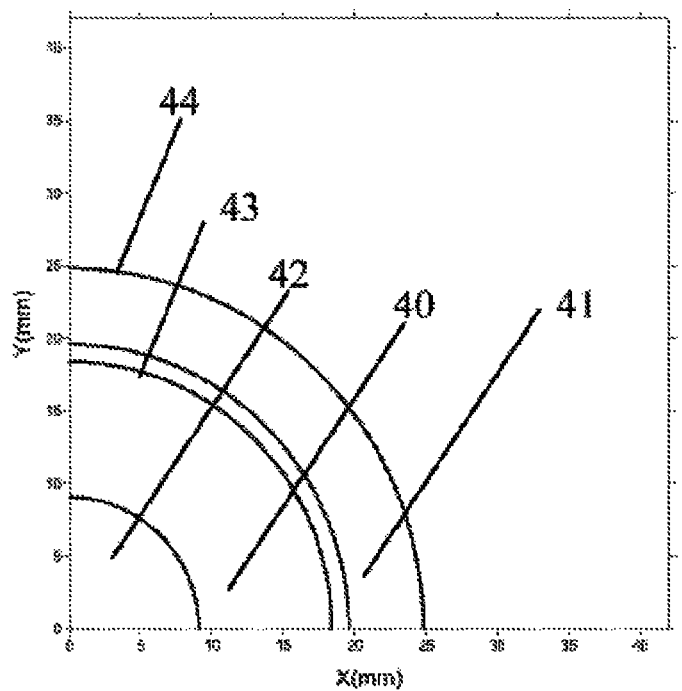

FIGS. 12, 13 and 14 are respectively distribution plots of isoline regions of three-dimensional magnetic fields Bx, By and Bz on a measurement plane 9 of a circular internal magnetic speaker, from which it can be seen that distribution positions of linear magnetic field measurement areas 36 and 39 in FIG. 12 and FIG. 13 are similar to those in the distribution plots of regions of the rectangular internal magnetic speaker, and one difference lies in that the regions are arc-shaped regions; in addition, non-linear magnetic field measurement areas 35 and 38 and saturation magnetic field measurement areas 34 and 37 are also arc-shaped, for Bz in FIG. 14, evidently different from the distribution plot of isolines of the corresponding rectangular internal magnetic speaker in FIG. 11, it has three linear magnetic field measurement areas 44, 43 and 42, corresponding to the distribution plot of the two-dimensional magnetic field By in FIG. 8, it can be found that a newly-added region is located in a magnetic field low value area in a nearby region of the magnetic field 0, the value of the magnetic field is specifically related to the size of the permanent magnetic circuit 4 and the magnetization intensity of the permanent magnet 5, the newly-added region may be located in a non-linear magnetic field measurement area or a linear magnetic field measurement area, in the rectangular internal magnetic speaker, the value thereof is only reduced to the non-linear magnetic field measurement area, while in the circular internal magnetic speaker, the value thereof is reduced to the linear magnetic field measurement area. The other difference lies in that there is no saturation magnetic field measurement area in FIG. 14.

Embodiment 3

Figure 15:
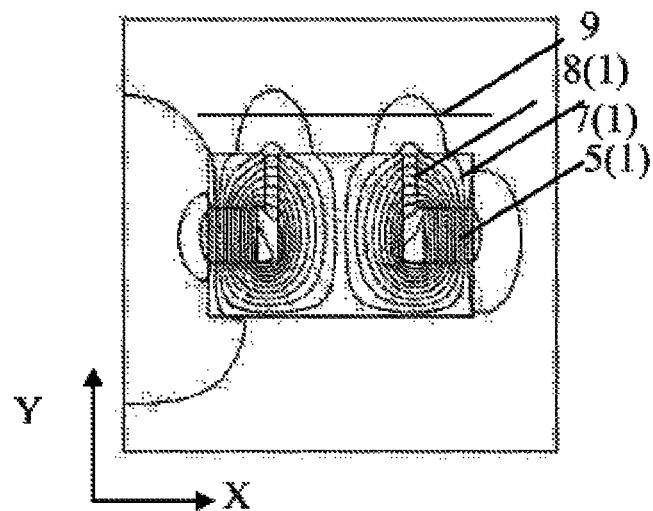
FIG. 15 is a distribution plot of two-dimensional magnetic force lines of DC magnetic fields of an external magnetic speaker.
Figure 16:
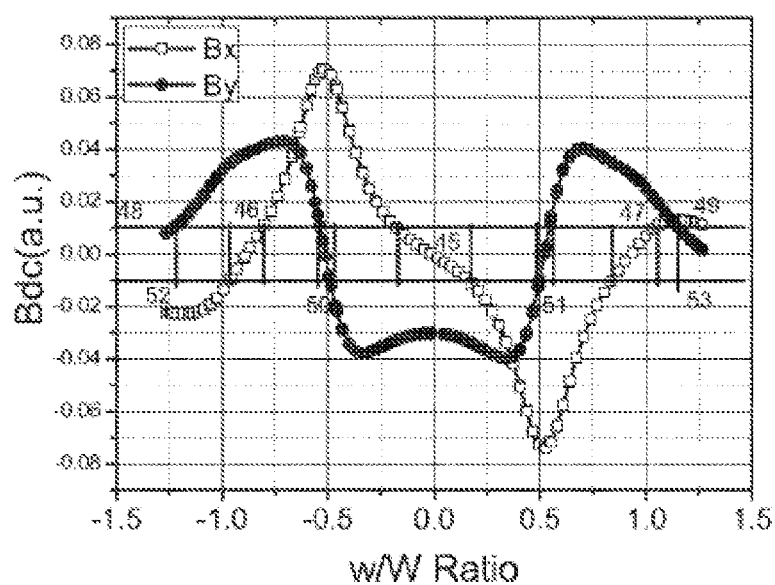
FIG. 16 is a distribution plot of two-dimensional DC magnetic fields on a measurement plane of an external magnetic speaker.

FIG. 15 is a distribution plot of two-dimensional magnetic force lines of a permanent magnetic circuit 4(1) of an external magnetic speaker, from which it can be seen that the magnetic force lines start from the permanent magnet 5(1) on the periphery of the voice coil, pass through the soft magnet 7(1) and cross the air gap 8(1), and pass through the soft magnet 6(1) to return to the permanent magnet 5(1); similarly, the distribution of magnetic fields thereof have axisymmetric characteristics. FIG. 16 is a distribution plot of two dimensional magnetic fields Bx and By on the measurement plane 9 along an X direction, from which it can be seen that Bx still has antisymmetric characteristics, while By has symmetric characteristics; for Bx, as two ends of the curve thereof directly cross Point 0, two linear magnetic field measurement areas 46 and 47 are added relative to the internal magnetic permanent magnetic circuit, in addition to the linear magnetic field measurement areas 45, 48 and 49. For By, the number of the linear magnetic field measurement areas remains the same, which are 50, 51, 52 and 53.

Figure 17:
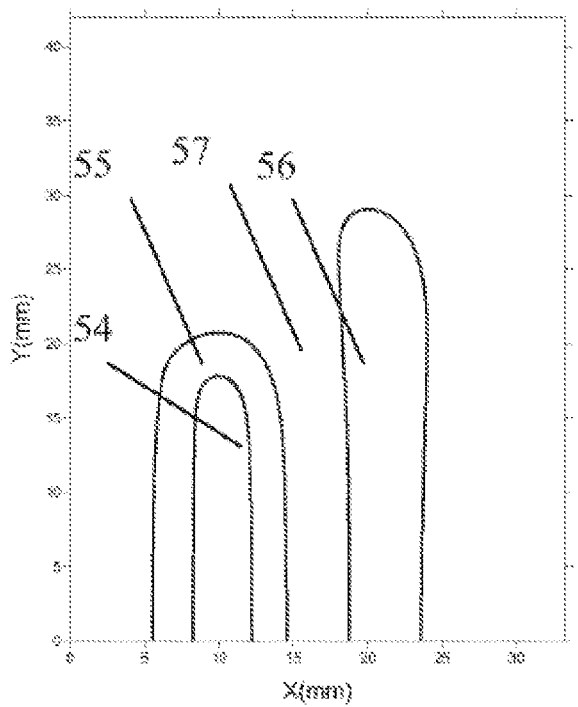
FIGS. 17-19 are respectively profiles of measurement areas of DC magnetic fields Bx, By and Bz on a measurement plane of an external magnetic rectangular speaker.
Figure 18:
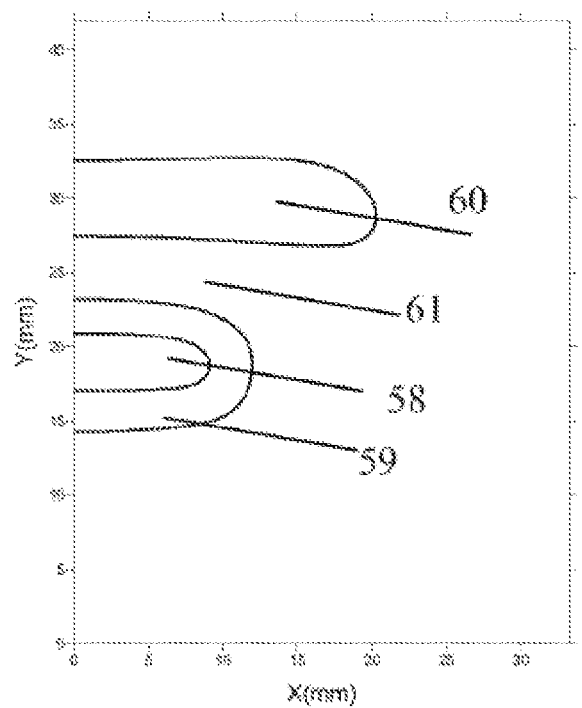
Figure 19:
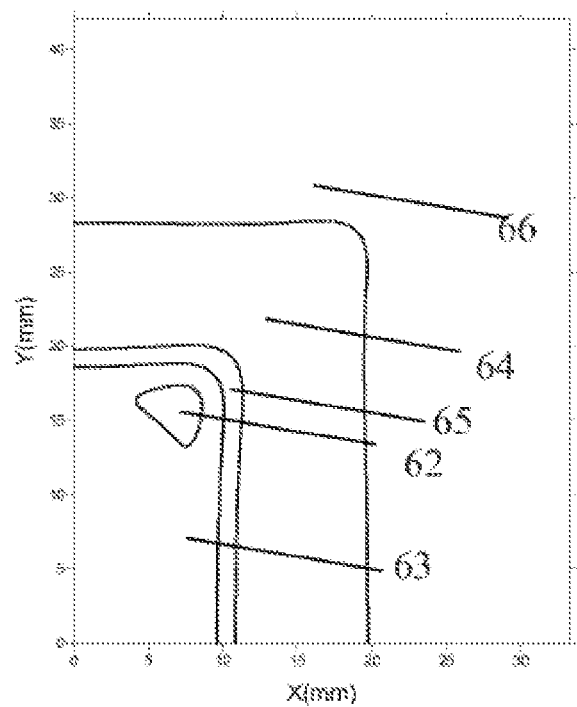

FIGS. 17, 18 and 19 are respectively distribution plots of isoline regions of three-dimensional magnetic fields Bx, By and Bz on the measurement plane, from which it can be seen that, different from the internal magnetic permanent magnetic circuit, in addition to the non-linear magnetic field measurement area 55, a non-linear magnetic field measurement area 56 is added, and peripheries of 55 and 56 correspond to the non-linear magnetic field measurement areas; seen from the distribution curve of the two-dimensional magnetic field Bx vs. the magnetic field X, the added regions 46 and 47 are actually regions located between 56 and 55; in a three-dimensional view, the linear magnetic field measurement area 57 is actually a whole, although the number of the linear magnetic field measurement areas is increased in terms of the distribution of the two-dimensional magnetic field, the number of the actual linear magnetic field measurement areas is decreased in terms of the distribution of the three-dimensional magnetic field.

Similarly, By in FIG. 18 also has similar characteristics, which include a linear magnetic field measurement area 61, a saturation magnetic field measurement area 58, and non-linear magnetic field measurement areas 59 and 60.

For Bz in FIG. 19, there is a saturation magnetic field measurement area 62 which is located at a corner of the voice coil, linear magnetic field measurement areas thereof are 65 and 66, wherein 65 is a narrow region in the voice coil, and 64 and 63 are non-linear magnetic field measurement areas.

Figure 20:
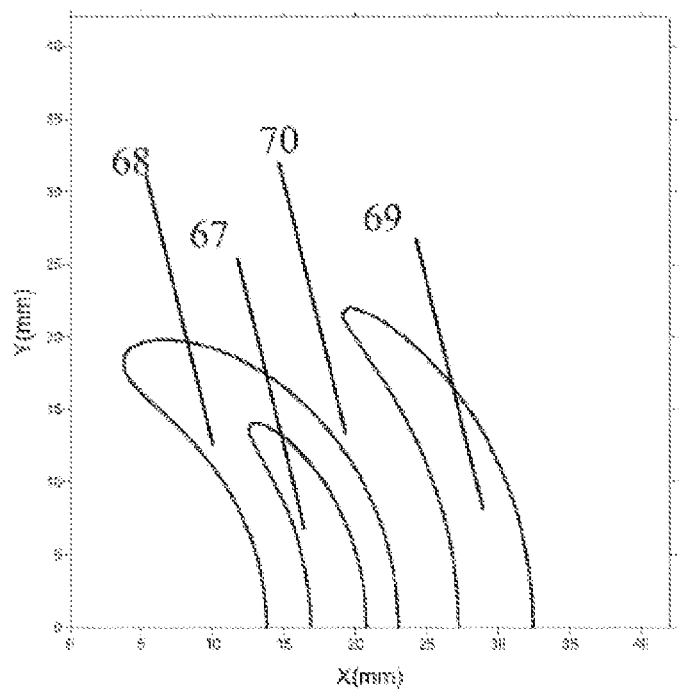
FIGS. 20-22 are respectively profiles of measurement areas of DC magnetic fields Bx, By and Bz on a measurement plane of an external magnetic circular speaker.
Figure 21:
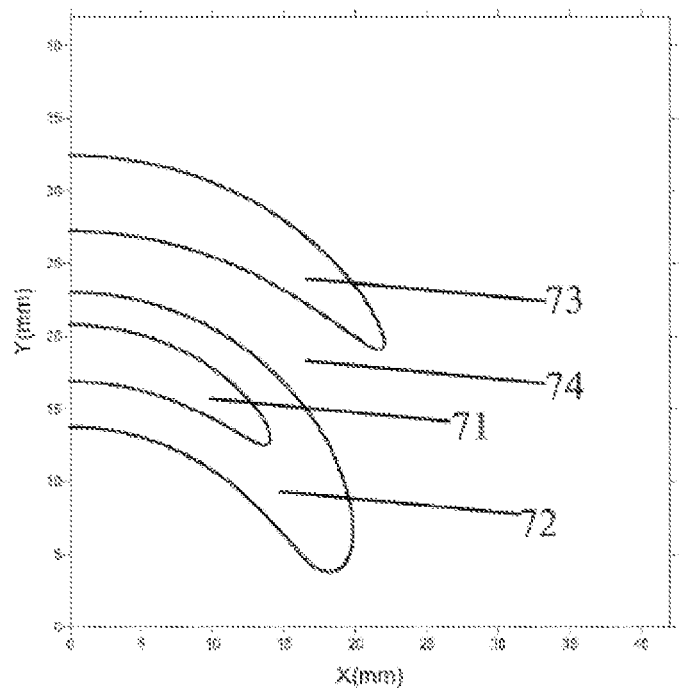
Figure 22:
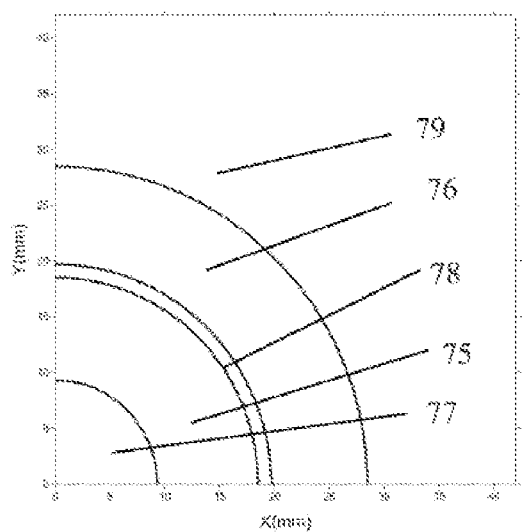

FIGS. 20, 21 and 22 are respectively distribution plots of isoline regions of three-dimensional magnetic fields Bx, By and Bz on a measurement plane 9 of a permanent magnetic circuit of a circular external magnetic speaker, from which it can be seen that, in addition to the arc-shaped distribution characteristics, linear magnetic field measurement areas 70 and 71, non-linear magnetic field measurement areas 68 and 69 and 72, 73 and saturation magnetic field measurement areas 67 and 71 thereof are very similar to those of the rectangular external magnetic permanent magnetic circuit. For Bz in FIG. 22, compared with the rectangular permanent magnetic circuit, there are no saturation magnetic field measurement areas, a linear magnetic field measurement area 77 is added in addition to the linear magnetic field measurement areas 79 and 78, and non-linear magnetic field measurement areas thereof are 76 and 75. This is very similar to the distribution characteristics of magnetic fields on the measurement plane 9 of the circular internal magnetic permanent magnetic circuit.

Embodiment 4

Figure 23:
FIG. 23 is a distribution plot of two-dimensional AC magnetic force lines of a voice coil of a speaker.
Figure 24:
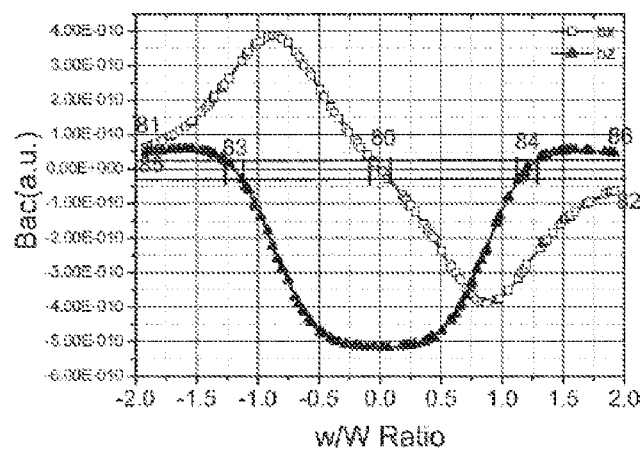
FIG. 24 is a distribution plot of two-dimensional AC magnetic fields on a measurement plane.

FIG. 23 is a distribution plot of two-dimensional AC magnetic force lines of the voice coil 3 of the speaker, in which the magnetic force lines start from the center, and cross the edge of the voice coil to return to the center, to form a closed loop. FIG. 24 is a distribution plot of two-dimensional AC magnetic fields bx and bz on the measurement plane 9, from which it can be seen that bx has antisymmetric distribution characteristics, while Bz has symmetric distribution characteristics.

Only by requiring the amplitude range of the AC magnetic fields to be greater than 1 mG, can sufficient signal response be generated; it can be seen from FIG. 24 that, for bx, there is an AC magnetic field non-measurement area 80 near a magnetic field 0 in the central region, and in addition, AC magnetic field non-measurement areas 81 and 82 are present in magnetic field attenuation regions on two ends respectively; while for bz, two AC magnetic field non-measurement areas 83 and 84 are present near two magnetic fields 0 on two ends, and in addition, two AC magnetic field non-measurement areas 85 and 86 are also present in magnetic field attenuation regions on two ends. As the value of 1 mG is very small, it can be seen that the AC magnetic field non-measurement areas thereof are very narrow.

Figure 25:
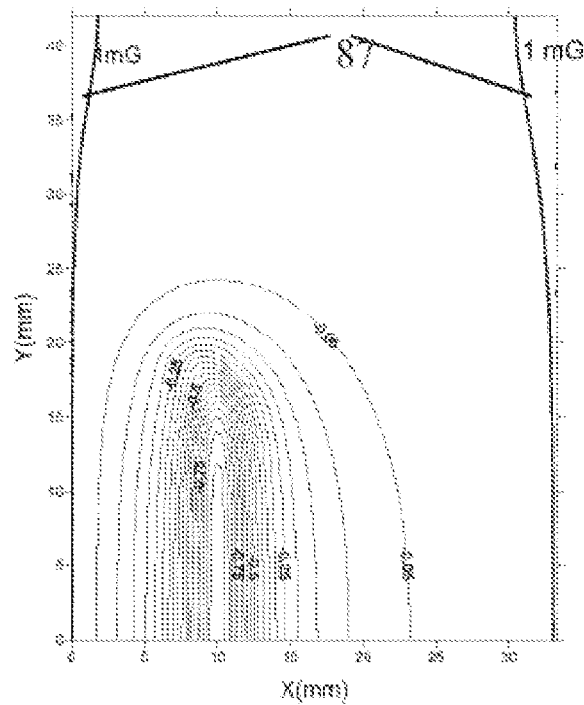
FIGS. 25-27 are respectively equipotential views of AC magnetic fields bx, by and bz on a measurement plane of a rectangular voice coil.
Figure 26:
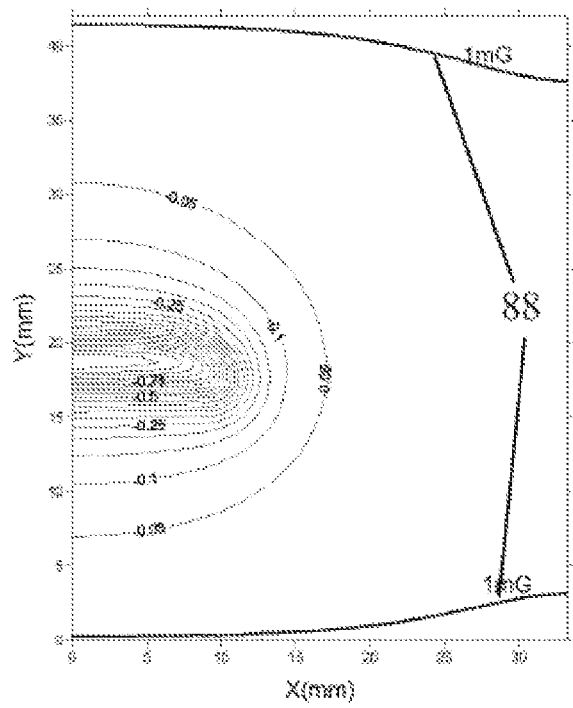
Figure 27:
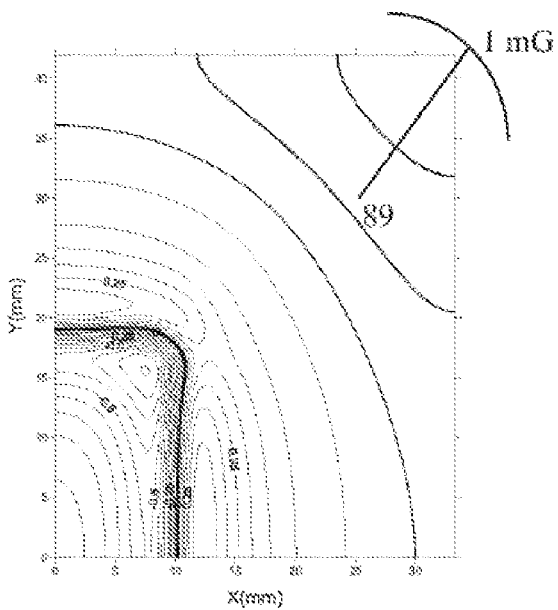
Figure 28:
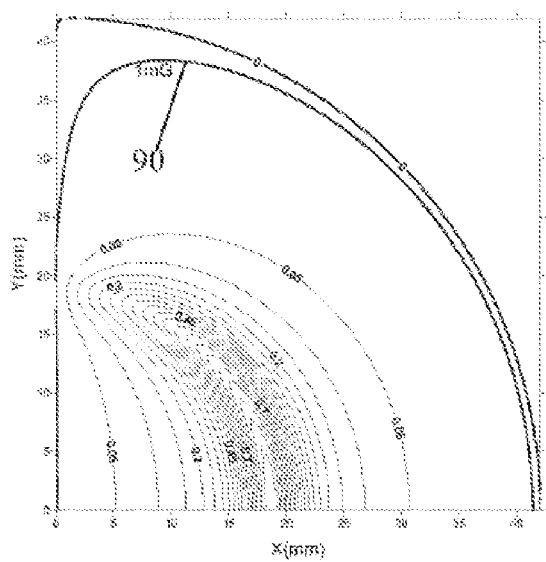
FIGS. 28-30 are respectively equipotential views of AC magnetic fields bx, by and bz on a measurement plane of a circular voice coil.
Figure 29:
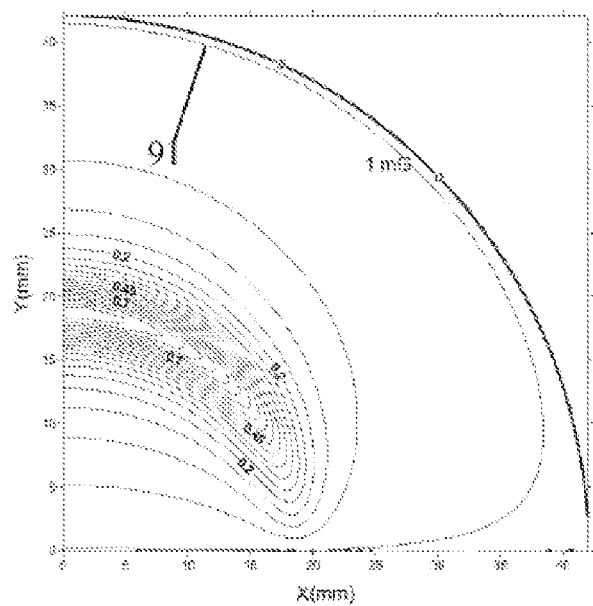
Figure 30:
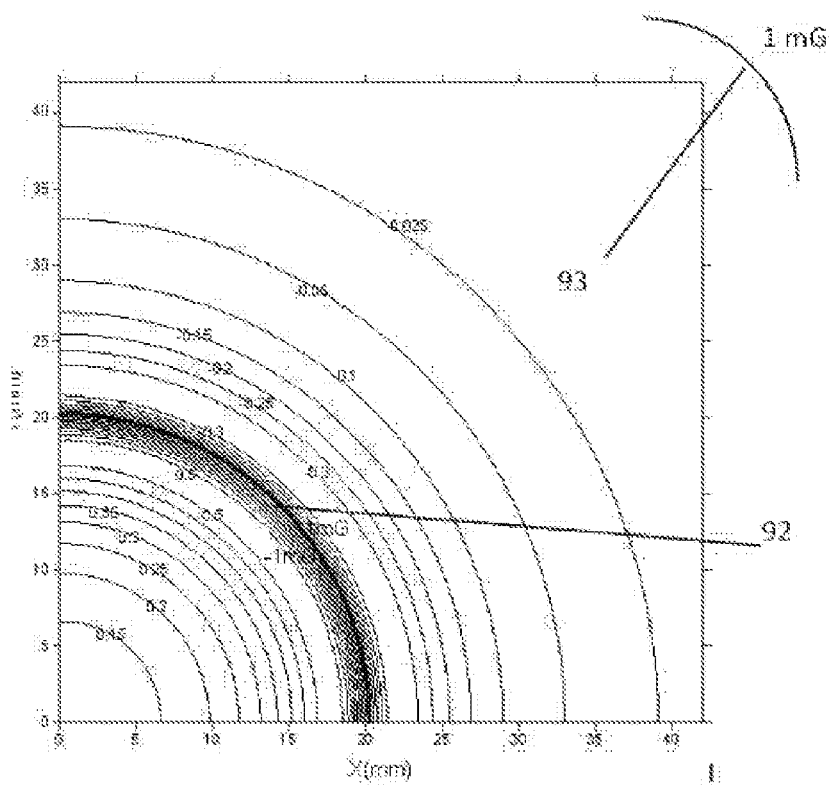

FIGS. 25, 26 and 27 are distribution plots of isolines of three-dimensional AC magnetic fields bx, by and bz on a measurement plane of a rectangular voice coil, from which it can be seen that, for bx, there are two isolines 87 of 1 mG, respectively located near a symmetry axis X and in a magnetic field attenuation area, which is identical with the result of the two-dimensional AC magnetic fields, and thus AC magnetic field measurement areas thereof are regions between them. For by, the result is also similar, and the isolines of 1 mG are 88, for bz, the isolines of 1 mG are 89 located in a narrow region near the isoline of the magnetic field 0 illustrated and in a magnetic field attenuation area; therefore, AC magnetic field measurement areas thereof are located in two regions of an equipotential line surrounding area of the magnetic field 0 and the region between the magnetic field 0 and 89. FIGS. 28, 29 and 30 are respectively distribution plots of isolines of three-dimensional AC magnetic fields bx, by and bz on a measurement plane 9 of a circular voice coil, isolines 90 and 91 of 1 mG are respectively located in regions near the isoline of the magnetic field 0, to form a closed shape, and AC magnetic field measurement areas thereof are located inside a closed curve; for bz shown in FIG. 30, there are a long and narrow region 92 near the magnetic field 0 and an isoline 93 of 1 mG near an attenuation magnetic field 0 beyond the edge; therefore, the AC magnetic field measurement areas are classified into two parts, respectively located between 92 and 93 and inside 92.

Embodiment 5

Figure 31:
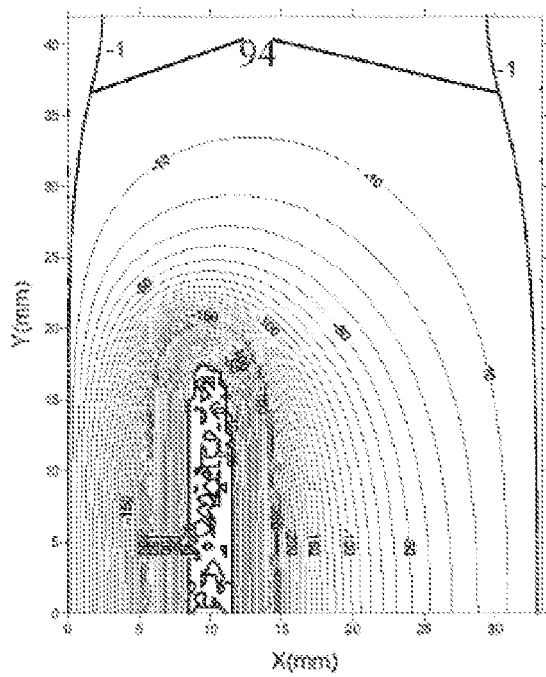
FIGS. 31-33 are respectively contour plots of the SNRs of magnetic field components detected by a linear magnetoresistive sensor in a measurement plane of a rectangular internal magnetic speaker in X, Y and Z directions.
Figure 32:
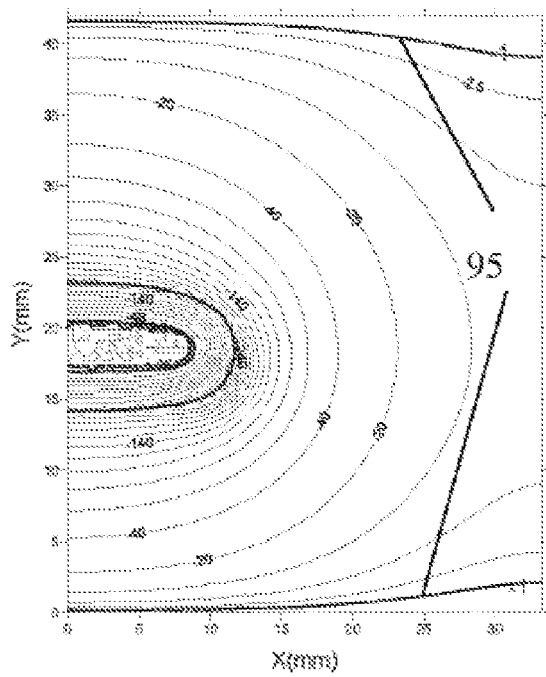
Figure 33:
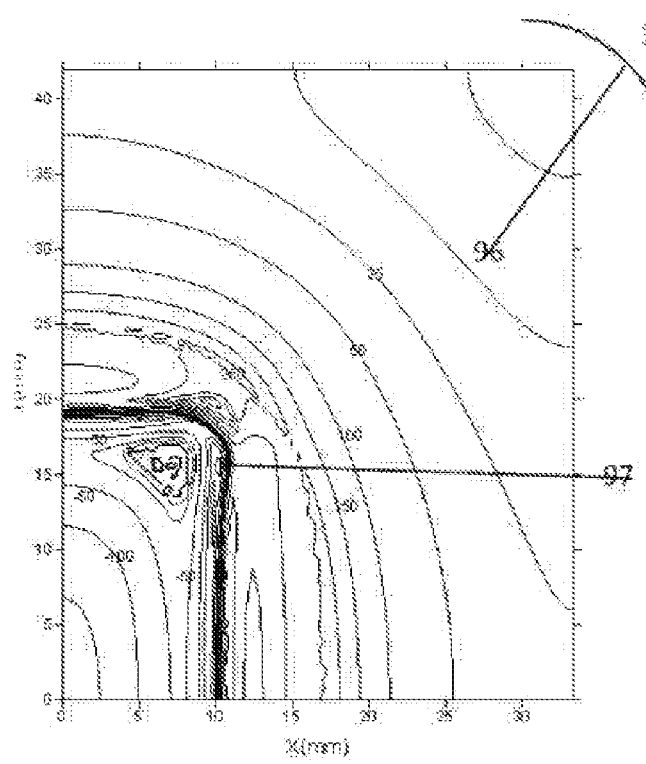

FIGS. 31, 32 and 33 are distribution plots of isolines of ratios of AC audio signals to Johnson thermal noise signals when magnetic field components of the corresponding linear magnetoresistive sensor 10 on a measurement plane 9 of an internal magnetic rectangular speaker are along directions X, Y and Z respectively; as effective signal detection can be implemented only when the SNR is greater than 1, it can be seen from FIGS. 31 and 32 that 94 and 95 are isolines with the SNR of 1 in X and Y directions respectively, wherein the surrounded regions are SNR measurement areas, and in addition, it can be seen from FIG. 33 that there are two regions in which the isolines are 1, one is located in a peripheral magnetic field attenuation area 96, and the other is near the value 0 of 97, which corresponds to two SNR measurement areas with one between 96 and 97, and the other within 97.

Figure 34:
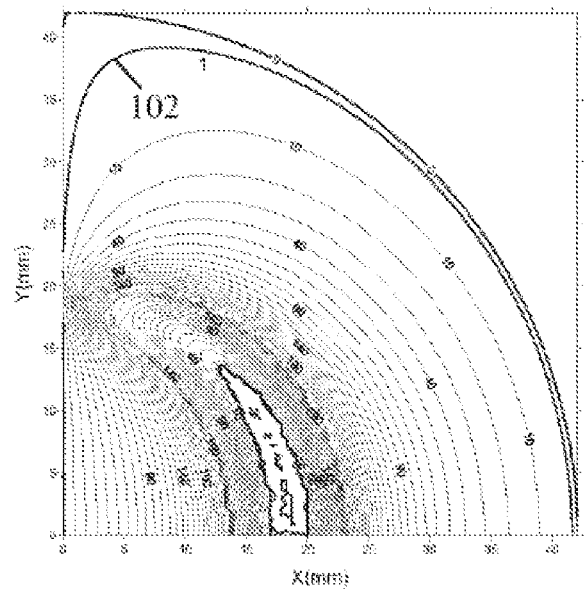
FIGS. 34-36 are respectively contour plots of SNRs of magnetic field components detected by a linear magnetoresistive sensor on a measurement plane of a circular internal magnetic speaker in X, Y and Z directions.
Figure 35:
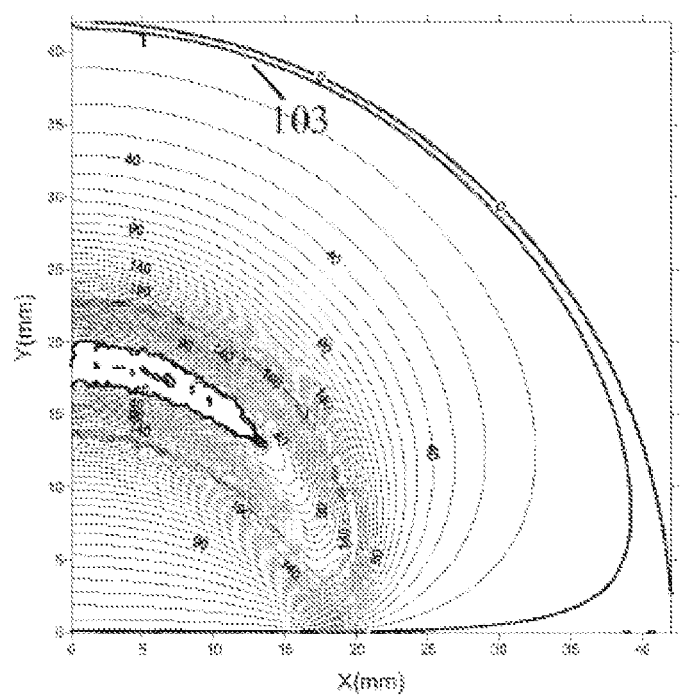
Figure 36:
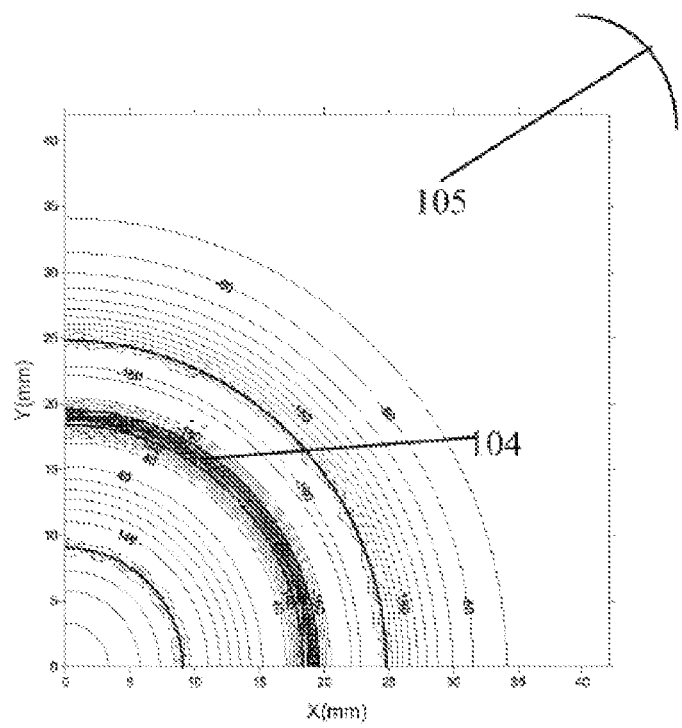

FIGS. 34, 35 and 36 are respectively distribution plots of SNR isolines of sensitive axes of the linear magnetoresistive sensor 10 on a measurement plane 9 of a corresponding internal magnetic circular speaker along directions X, Y and Z; it can be seen from FIGS. 34 and 35 that isolines 102 and 103 of which the SNR is 1 are near the magnetic field 0, and regions surrounded therein are SNR measurement areas; in FIG. 36, there are two regions in which the SNR of the isoline is 1, that is, 104 and 105 which is on the periphery, and thus the SNR measurement areas thereof are classified into two parts, one is located between 104 and 105, and the other is located in 104.

Embodiment 6

Figure 37:
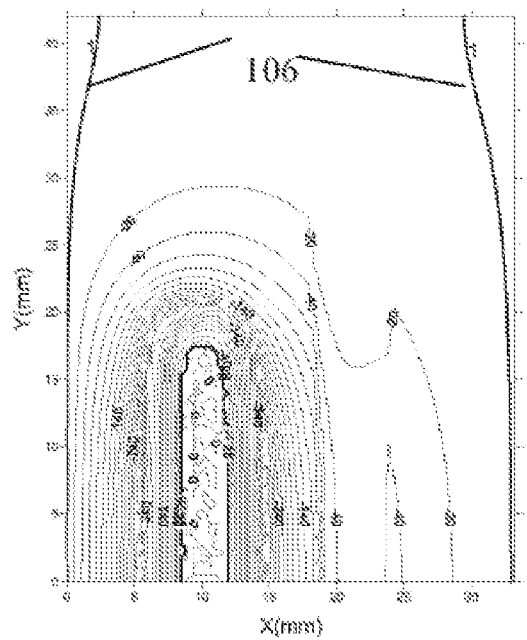
FIGS. 37-39 are respectively contour plots of SNRs of magnetic field components detected by a linear magnetoresistive sensor on a measurement plane of a rectangular external magnetic speaker in X, Y and Z directions.
Figure 38:
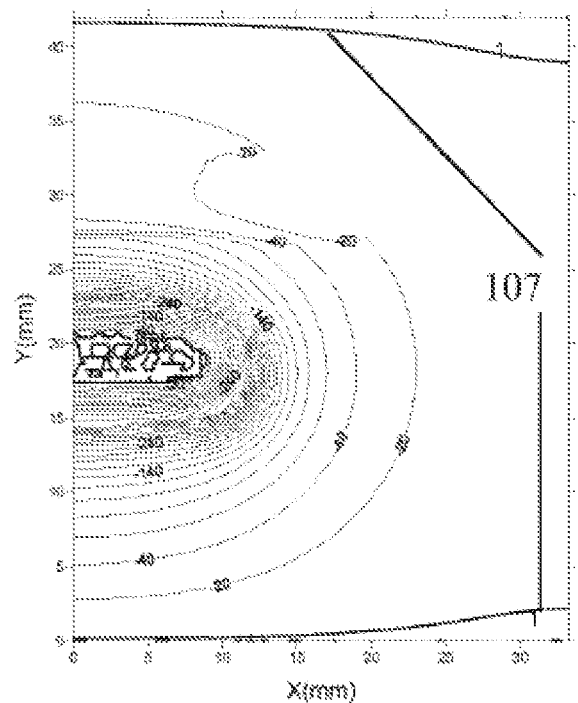
Figure 39:
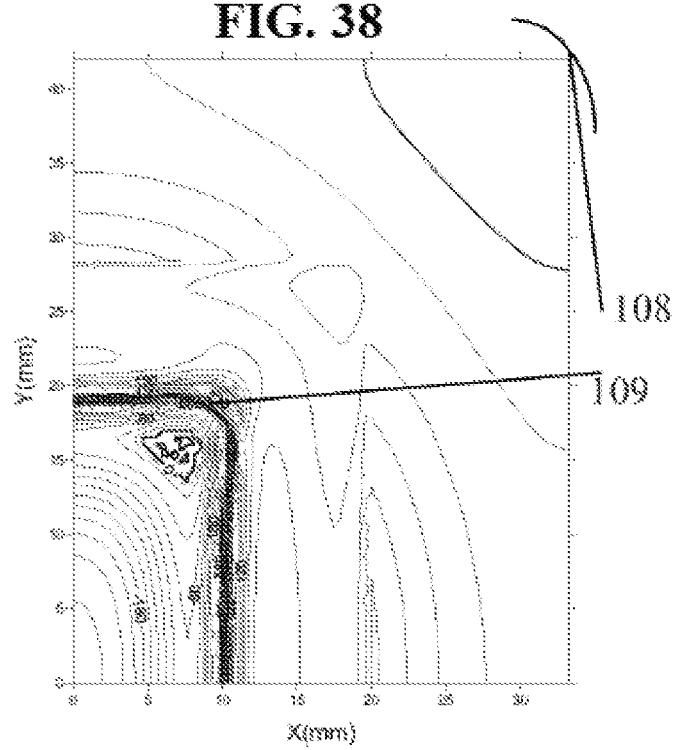

FIGS. 37, 38 and 39 are distribution plots of SNR isolines when sensitive magnetic fields of the linear magnetoresistive sensor 10 on a measurement plane 9 of a corresponding external magnetic rectangular speaker are along directions X, Y and Z, from which it can be seen that 106 and 107 are respectively profiles of isolines of which the values are 1, and regions surrounded by them are SNR measurement areas. For the Z-direction SNR view, there are two isolines of which the values are 1, being 108 and 109 respectively, 108 is located in an attenuation area, and thus there are two SNR measurement areas within the region 109 and between 109 and 108.

Figures 40, 41:
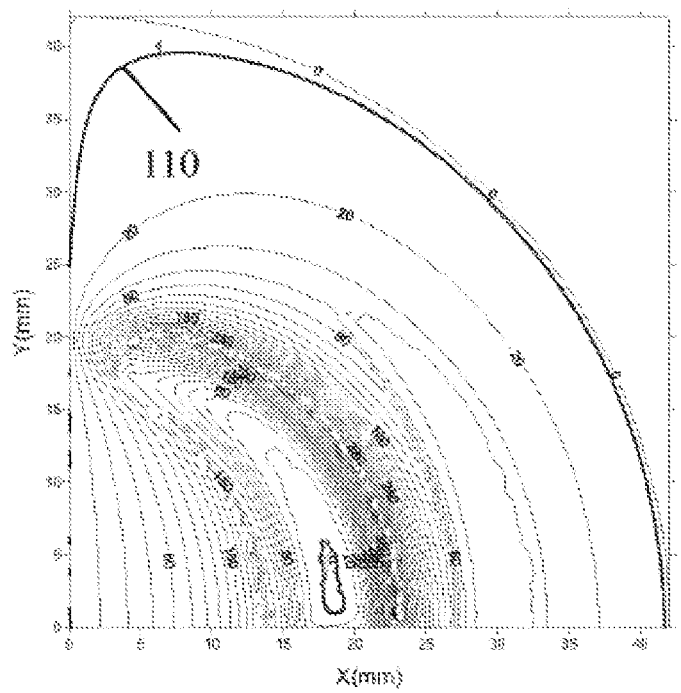
FIGS. 40-42 are respectively contour plots of SNRs of magnetic field components detected by a linear magnetoresistive sensor on a measurement plane of a circular external magnetic speaker in X, Y and Z directions.
Figure 42:
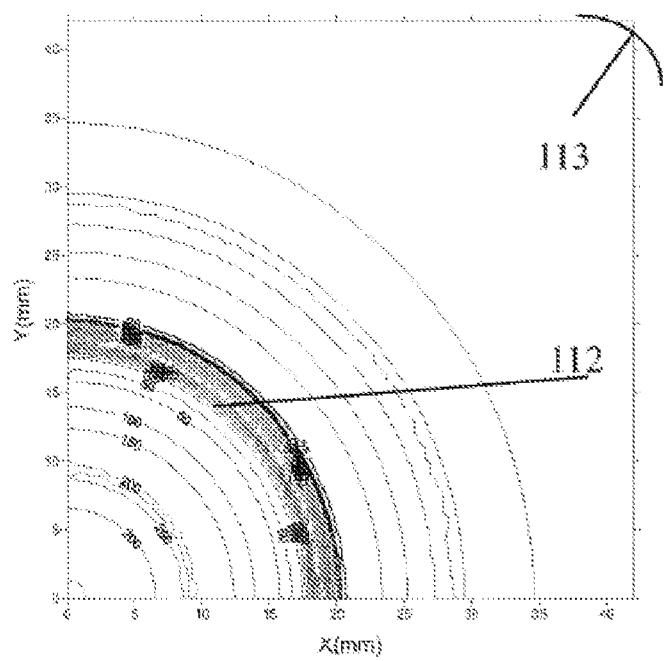

FIGS. 40, 41 and 42 are respectively distribution plots of SNRs when magnetic field components detected by the linear magnetoresistive sensor 10 on a measurement plane 9 of a corresponding external magnetic circular speaker are along directions X, Y and Z, from which it can be seen that regions surrounded by isolines 110 and 111 of which the X- and Y-direction SNRs are 1 are SNR measurement areas on a corresponding external magnetic circular detection plane 9. For the Z direction, isolines 112 and 113 of which the SNRs are 1 form two SNR measurement areas, one is the region internal to 112, the other is a region between 112 and 113, and 113 is located in the magnetic field attenuation area.

Embodiment 7

Figure 43:
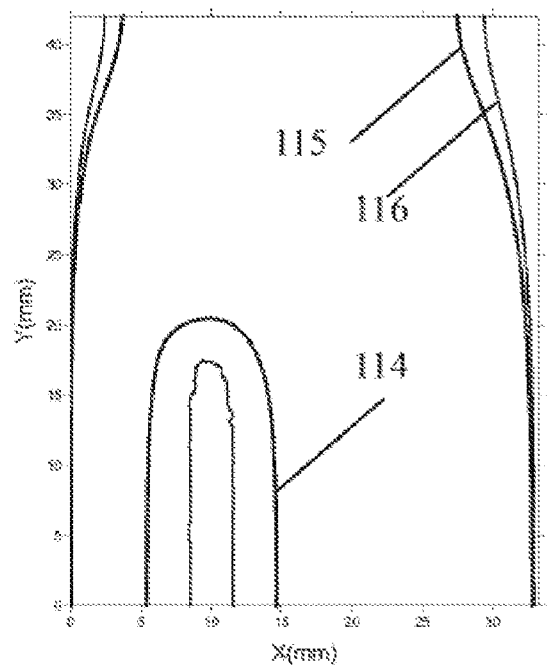
FIGS. 43-45 are respectively distribution plots of measurement areas of magnetic field components detected by a linear magnetoresistive sensor on a measurement plane of a rectangular external magnetic speaker in X, Y and Z directions.
Figure 44:
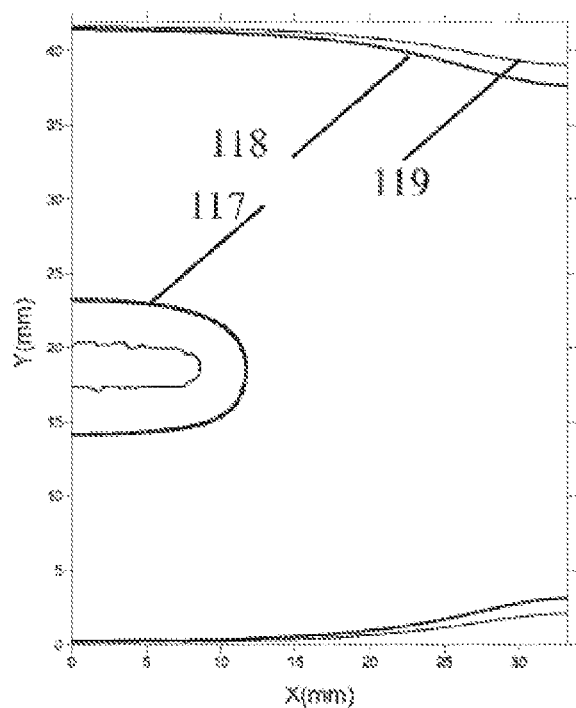
Figure 45:
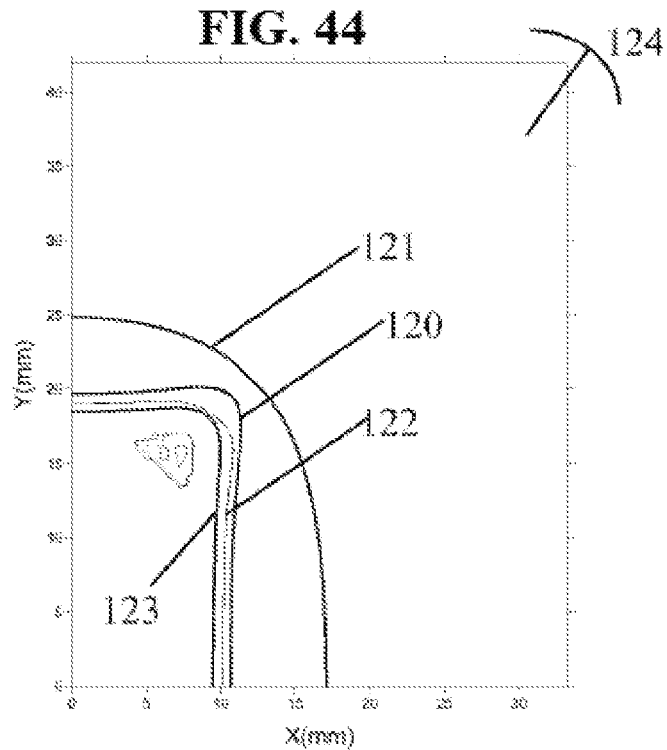

FIGS. 43, 44 and 45 are respectively distribution plots of measurement areas when magnetic field components detected by the linear magnetoresistive sensor 10 on a measurement plane 9 of an internal magnetic rectangular speaker are along directions X, Y and Z respectively, wherein 114 is a linear magnetic field measurement area boundary, 115 is an AC magnetic field measurement area boundary, 116 is a SNR measurement area boundary, wherein an AC magnetic field measurement area boundary 118 is located inside a SNR measurement area boundary 119, therefore, an X-axis working area is located in a region formed by 118 and 117. Similarly, a Y-axis working area is within a boundary region formed by the linear magnetic field measurement area boundary 117 and the AC magnetic field measurement area boundary 118. A Z-axis working area is divided as follows: a first region located between a linear magnetic field measurement area boundary 121 and an AC magnetic field measurement area boundary 124 of an attenuation area, a second region located between a linear magnetic field measurement area boundary 120 and an AC magnetic field measurement area boundary 122, and a third region located between a linear magnetic field measurement area boundary 123 and the AC magnetic field measurement area boundary 122, and the region where 122 is located is very narrow.

Figure 46:
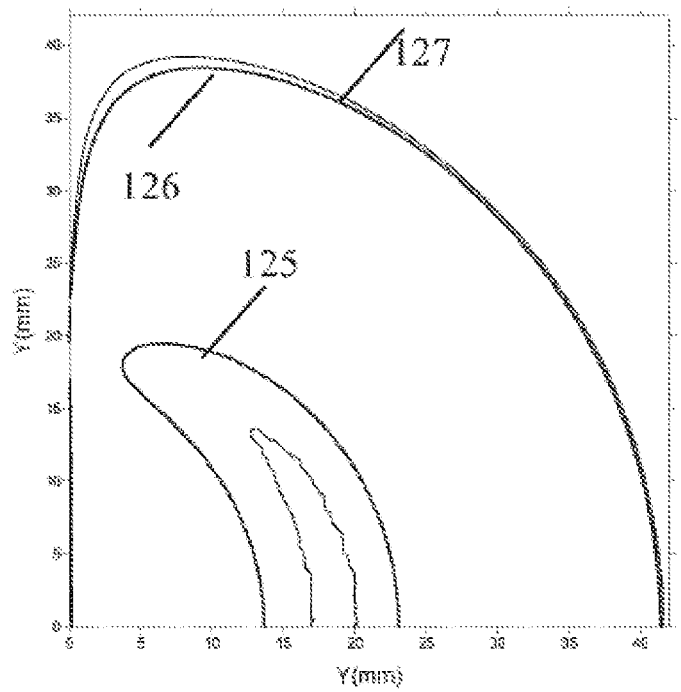
FIGS. 46-48 are respectively distribution plots of measurement areas of magnetic field components detected by a linear magnetoresistive sensor on a measurement plane of a circular external magnetic speaker in X, Y and Z directions.
Figure 47:
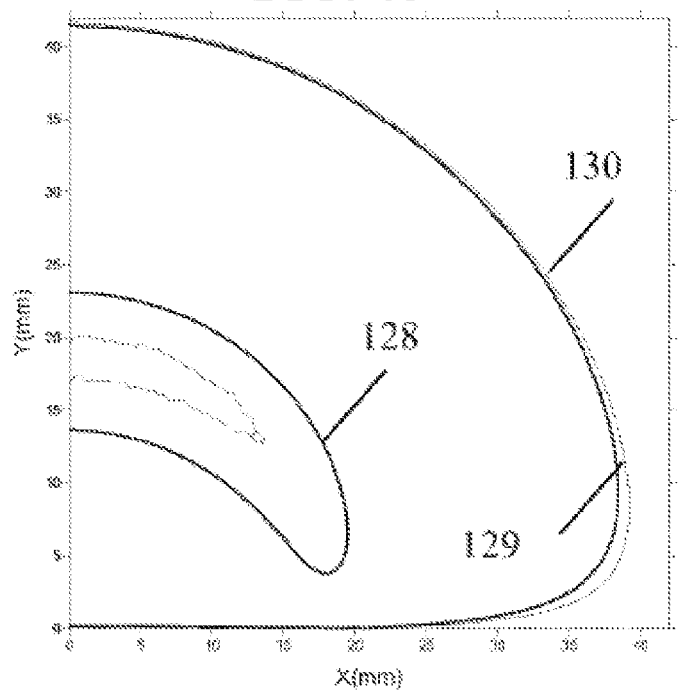
Figure 48:
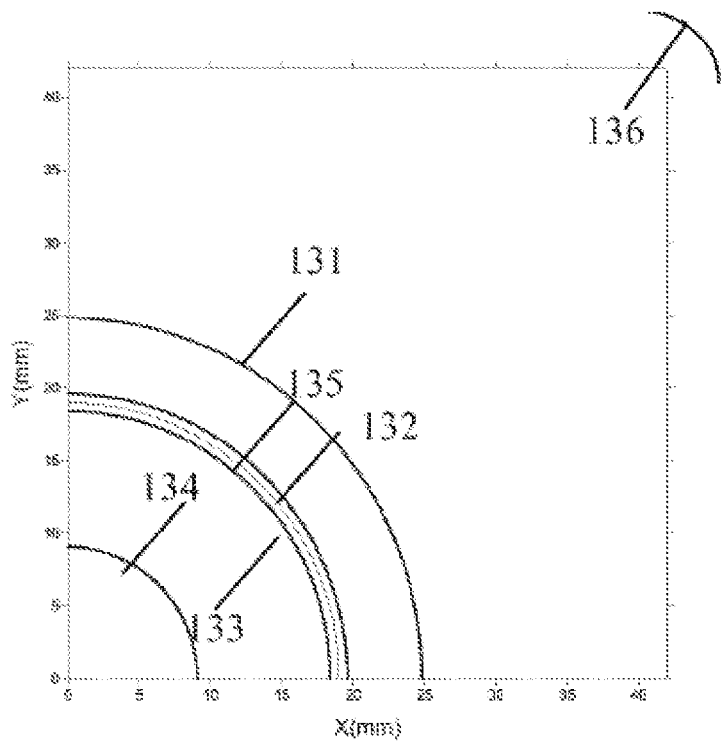

FIGS. 46, 47 and 48 are respectively distribution plots of measurement areas when magnetic field components detected by the linear magnetoresistive sensor 10 on a measurement plane 9 of an internal magnetic rectangular speaker are along directions X, Y and Z respectively; similarly, an X-axis working area is a region located between a linear magnetic field measurement area boundary 125 and an AC magnetic field measurement area boundary 126, and a SNR measurement area boundary 127 is located outside 126. A Y-axis working area is a region located between a linear magnetic field measurement area boundary 128 and an AC magnetic field measurement area boundary 129, and a SNR measurement area boundary 130 is located outside 129. A Z-axis working area is also divided into four parts, the first one is located between a linear magnetic field measurement area boundary 131 and an AC magnetic field measurement area boundary 136, the second one is located between a linear magnetic field measurement area boundary 135 and an AC magnetic field measurement area 132, the third one is located between 135 and a linear magnetic field measurement area boundary 133, and the fourth one is located within a linear magnetic field measurement area boundary 134.

Figure 49:
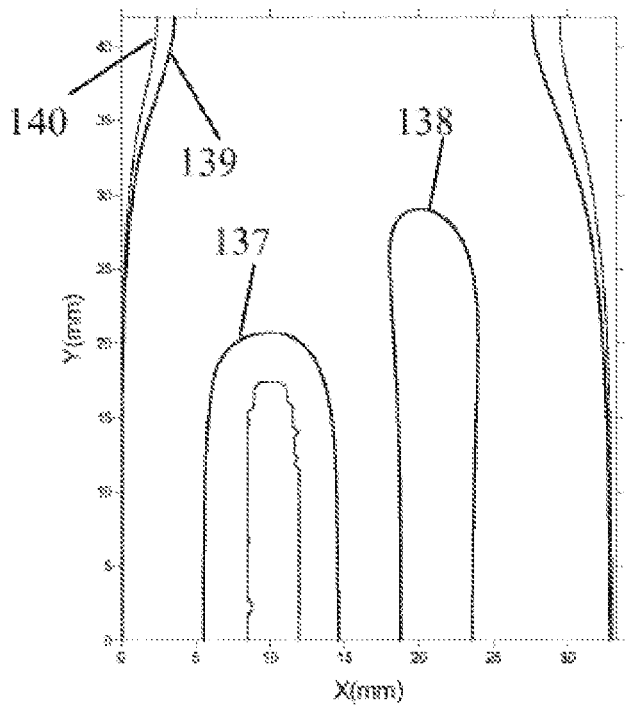
FIGS. 49-51 are respectively distribution plots of measurement areas magnetic field components detected by of a linear magnetoresistive sensor on a measurement plane of a rectangular internal magnetic speaker in X, Y and Z directions.
Figure 50:
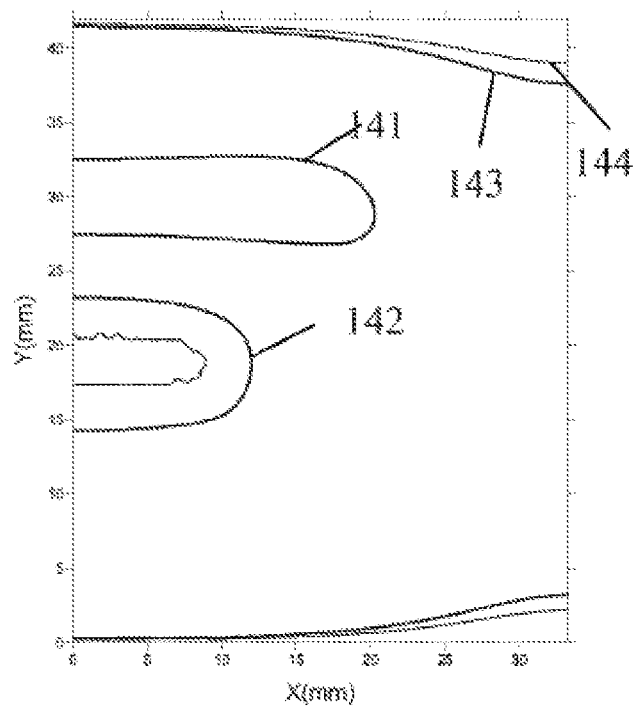
Figure 51:
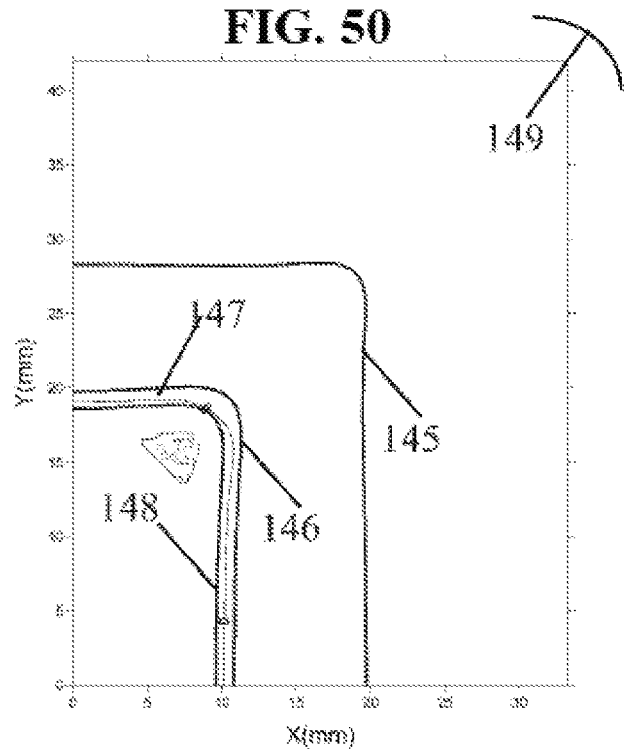

FIGS. 49, 50 and 51 are respectively distribution plots of measurement areas when magnetic field components detected by the linear magnetoresistive sensor 10 on a measurement plane 9 of an external magnetic rectangular speaker are along directions X, Y and Z respectively; an X-axis working area is a region located between linear magnetic field measurement area boundaries 137, 138 and an AC magnetic field measurement area boundary 139, and 140 is a SNR measurement area boundary which is located outside 139. A Y-axis working area is a region located between linear magnetic field measurement area boundaries 141, 142 and an AC magnetic field measurement area boundary 143, and 144 is a SNR measurement area boundary which is located outside 143. A Z-axis working area includes three regions, the first one is located between a linear magnetic field measurement area boundary 145 and an AC magnetic field measurement area boundary 149, the second one is located between a linear magnetic field measurement area boundary 146 and an AC magnetic field measurement area boundary 146, and the third one is located between an AC magnetic field measurement area boundary 146 and a linear magnetic field measurement area boundary 148.

Figure 52:
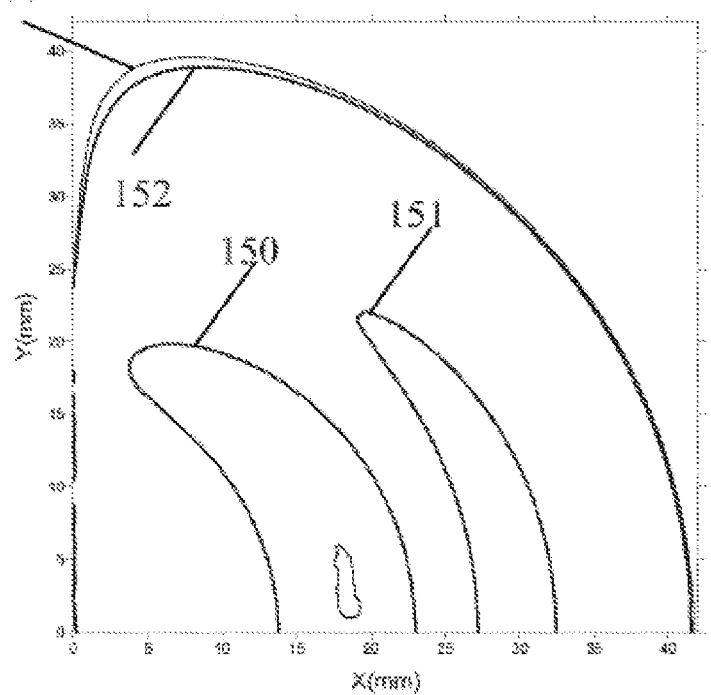
FIGS. 52-54 are respectively distribution plots of measurement areas magnetic field components detected by a linear magnetoresistive sensor on a measurement plane of a circular internal magnetic speaker in X, Y and Z directions.
Figure 53:
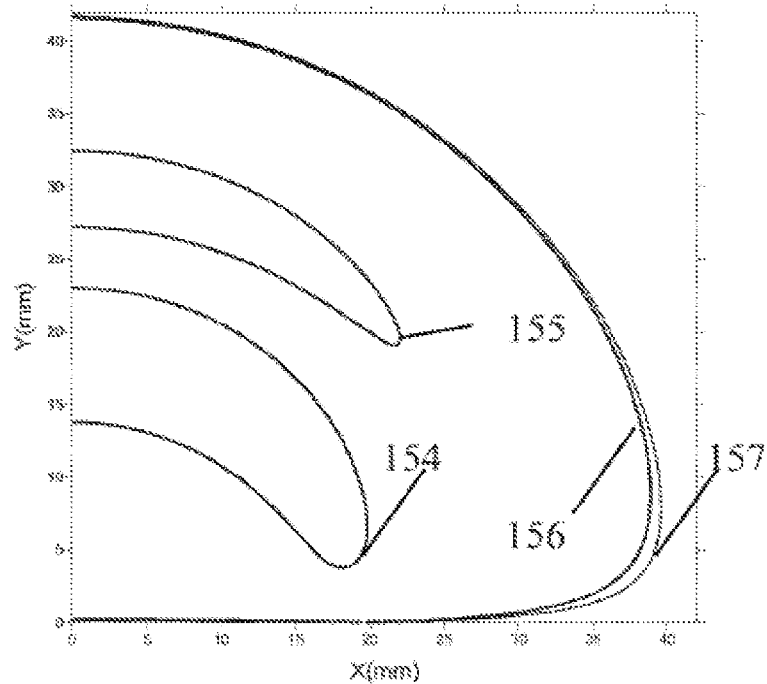
Figure 54:
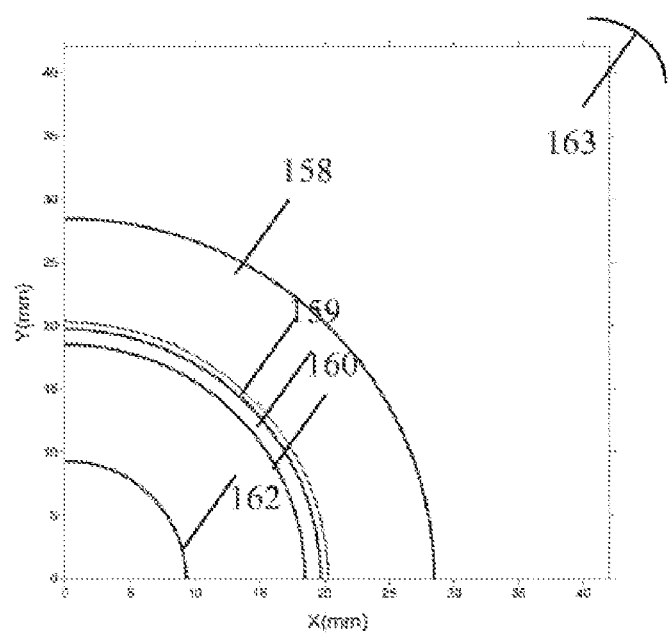

FIGS. 52, 53 and 54 are respectively distribution plots of measurement areas when magnetic field components detected by the linear magnetoresistive sensor 10 on a measurement plane 9 of an external magnetic circular speaker are along directions X, Y and Z respectively; an X-axis working area is a region located between linear magnetic field measurement area boundaries 150, 151 and an AC magnetic field measurement area boundary 152, and 153 is a SNR measurement area boundary which is located outside 152. A Y-axis working area is a region located between linear magnetic field measurement area boundaries 154, 155 and an AC magnetic field measurement area boundary 156, and 157 is a SNR measurement area boundary which is located outside 156. A Z-axis working area includes three regions, the first one is located between a linear magnetic field measurement area boundary 158 and an AC magnetic field measurement area boundary 163, the second one is located between a linear magnetic field measurement area boundary 160 and an AC magnetic field measurement area 161, wherein the AC magnetic field measurement area boundary is outside the measurement region, and the third one is located within a linear magnetic field measurement area boundary 162.

Embodiment 8

Figure 55:
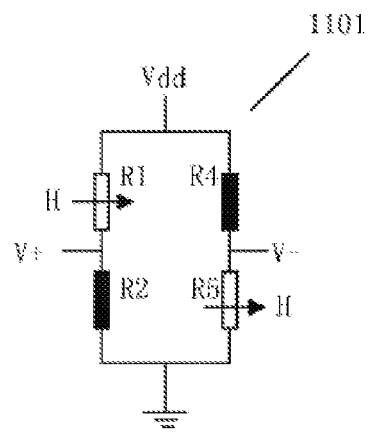
FIGS. 55-57 are respectively schematic views of full-bridge, half-bridge and push-pull full-bridge linear magnetoresistive sensors.
Figure 56:
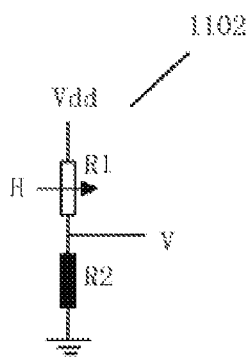
Figure 57:
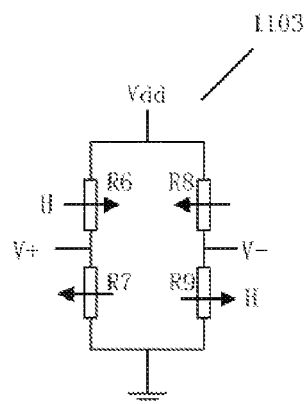

FIGS. 55, 56 and 57 are structural views of the linear magnetoresistive sensor 10, FIG. 55 shows a full-bridge structure 1101 which includes four magnetoresistive sensor units R1, R2, R4 and R5, wherein R2 and R4 are reference units, while R1 and R5 are sensitive units and have the same directions of sensitive axes. FIG. 56 shows a half-bridge structure 1102 which includes two magnetoresistive units R1 and R2, wherein R2 is a reference unit, R1 is a sensitive unit, and signals are output from the middle of the half bridge. FIG. 57 shows a push-pull full-bridge structure 1103, two adjacent magnetoresistive sensor units R6, R7 and R8, R9 in the same bridge arm have opposite directions of magnetic field sensitive axes, and two opposite magnetoresistive sensors R6, R8 and R7, R9 in two bridge arms have opposite directions of magnetic field sensitive axes. The magnetoresistive sensor units may be one of Hall, AMR, GMR or TMR sensor; in addition, the full-bridge structure 1101, the half-bridge structure 1102 and the push-pull full-bridge structure 1103 of the linear magnetoresistive sensor 10 may be linear magnetoresistive sensor structures whose magnetic field sensitive directions are along an X, Y or Z direction.

Embodiment 9

An embodiment of the present invention further provides a magnetoresistive audio pickup, specifically, a control circuit is disposed in the audio pickup, to detect whether each of the single-axis linear magnetoresistive sensor units is located in a linear magnetic field measurement area on the measurement plane or not, and when it is detected that the single-axis linear magnetoresistive sensor unit is in a linear magnetic field working area, output multiple control signals to perform some or all of the following operations: for example, controlling the detected single-axis linear magnetoresistive sensor unit to switch to DC power supply, turning on the power of the AC amplifier, turning on the power of the amplifier, turning on the power of the signal processing circuit, and turning on magnetically labeled signals; when it is detected that the single-axis linear magnetoresistive sensor is not in the linear magnetic field working area, outputting multiple control signals to control some or all of the following operations: for example, switching the detected single-axis linear magnetoresistive sensor unit to pulsed power supply, turning off the power of the AC amplifier, turning off the power of the amplifier, turning off the power of the signal processing circuit, and turning off the magnetically labeled signals.

Figure 58:
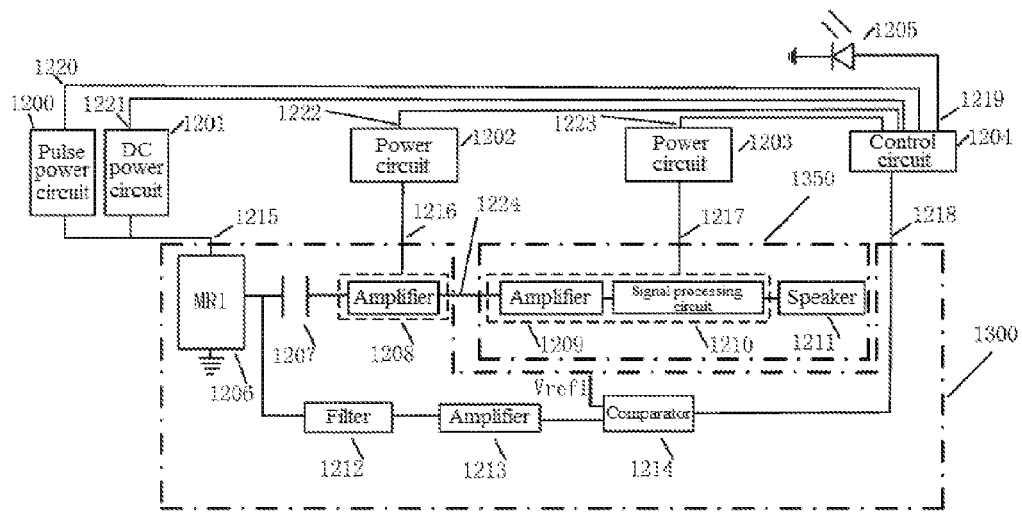
FIG. 58 is a view of an audio pickup system of a single-axis linear magnetoresistive sensor of a DC output type control circuit.
Figure 59:
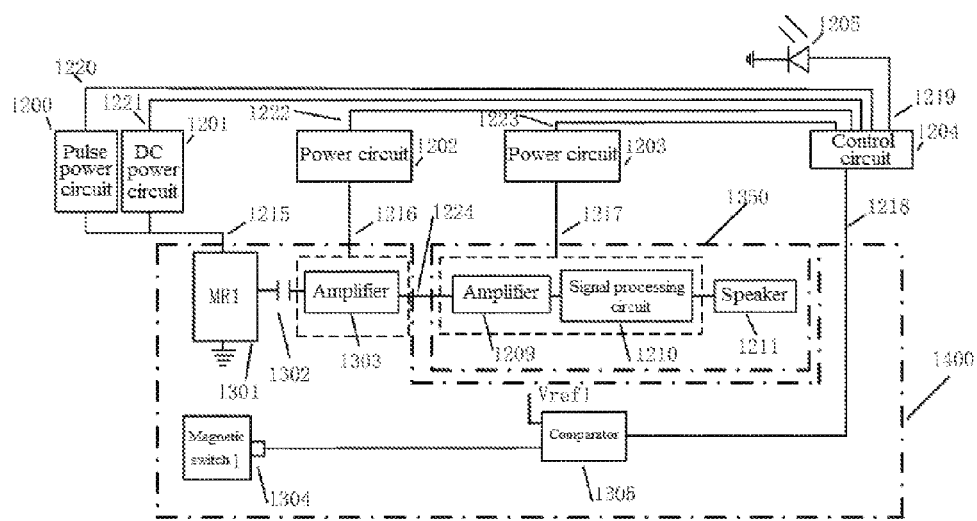
FIG. 59 is a view of an audio pickup system of a single-axis linear magnetoresistive sensor of a magnetic switch type control circuit.

FIGS. 58 and 59 are respectively schematic views of circuit systems of a single-axis audio pickup of two different control circuit types, that is, DC output type and magnetic switch type, which may be a circuit diagram of a smart audio pickup system of a single-axis linear magnetoresistive sensor, and may also be a circuit diagram of each single-axis linear magnetoresistive sensor in an audio pickup system of a two-axis or three-axis linear magnetoresistive sensor, wherein the two-axis or three-axis linear magnetoresistive sensor is a combination of discrete elements of multiple single-axis linear magnetoresistive sensor units or a single chip element integrating multiple single-axis linear magnetoresistive sensor units; it should be noted that, for a single-axis, two-axis or three-axis linear magnetoresistive sensor, each axial direction corresponding thereto may include at least one linear magnetoresistive sensor unit in the same axial direction.

FIG. 58 and FIG. 59 both include two parts: an audio pickup circuit and a control circuit, wherein the audio pickup circuit includes a single-axis linear magnetoresistive sensor unit 1206, a coupling capacitor 1207, a prepositive/differential AC amplifier 1208, a prepositive/summing amplifier 1209 and a signal processing circuit 1210. The signal output end of the single-axis linear magnetoresistive sensor 1206 removes DC output signals via the coupling capacitor 1207, to obtain AC output signals, if 1206 is the half-bridge structure 1102, the signal output end of one end thereof is amplified with the prepositive amplifier 1209, if 1206 is the full-bridge structure 1101 or the push-pull structure 1103, two signal output ends are connected to two input ends of the differential amplifier 1208 via the coupling capacitor 1207 respectively, the output signal end of the prepositive/differential AC amplifier 1208 is connected to the input end of the prepositive/summing amplifier 1209, if the single-axis linear magnetoresistive sensor 1206 is a single-axis linear magnetoresistive sensor audio pickup system, 1208 is directly connected to the input end of the prepositive amplifier 1209, if 1206 is any single-axis linear magnetoresistive sensor of the two-axis or three-axis linear magnetoresistive sensors, 1208 is connected to one input end of the summing amplifier 1209, and the signal output end of the prepositive/summing amplifier 1209 is connected to the signal processing circuit 1210, which then outputs audio signals.

The control circuit is divided into two types, one is the DC output type shown in FIG. 58, and the other is the magnetic switch type shown in FIG. 59; FIG. 58 includes a filter 1212, a prepositive/differential amplifier 1213, a comparator 1214 and a controller 1204. If 1206 is the half-bridge structure 1102, the signal output end of one end thereof is connected to the prepositive amplifier 1213 via the filter 1212 to obtain DC output signals which are then compared with a reference voltage signal of the comparator 1214, a reference voltage is corresponding to a linear magnetic field characteristic area limit of 1206, the comparator outputs a logic signal I/O to correspondingly judge whether the detected single-axis linear magnetoresistive sensor unit 1206 is in a linear magnetic field characteristic area or not, the logic signal is input to the controller 1204, the controller outputs signals to control switching of DC power/pulse power of the single-axis linear magnetoresistive sensor unit 1206, turn-on and turn-off of the power of the AC prepositive/differential amplifier 1208, turn-on and turn-off of the power of the prepositive/summing amplifier 1209 and the signal processing circuit 1210, and turn-on and turn-off of the magnetically labeled signals.

Figure 60:
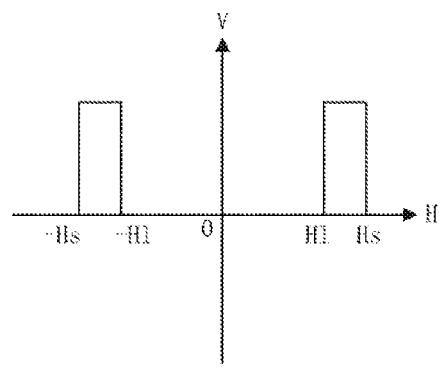
FIG. 60 is a characteristic curve of external magnetic field vs. output voltage of a magnetic switch sensor.

FIG. 59 includes a single-axis magnetic switch sensor 1304, of which the sensitive direction is identical with that of the detected single-axis linear magnetoresistive sensor unit 1206, and a single-axis magnetic switch sensor is an all-pole switch, the corresponding magnetic field output characteristic curve is as shown in FIG. 60, an operating magnetic field and a restoring magnetic field corresponding thereto are limit values of a linear magnetic field and a saturation magnetic field of each of the single-axis linear magnetoresistive sensor units, a reference voltage passing through the comparator 1305 corresponds to an output characteristic voltage of the magnetic switch sensor, so as to judge whether the detected single-axis linear magnetoresistive sensor unit 1206 is in the single component working area or not to convert the reference voltage to a logic signal I/O which is input into the controller 1204, the controller outputs signals to control switching of DC power/pulse power of the single-axis linear magnetoresistive sensor unit 1206, turn-on and turn-off of the power of the AC prepositive/differential amplifier 1208, turn-on and turn-off of the power of the prepositive/summing amplifier 1209 and the signal processing circuit 1210, and turn-on and turn-off of the magnetically labeled signals. The magnetic switch sensor may be a single-axis, two-axis or three-axis magnetic switch sensor, and the two-axis or three-axis magnetic switch sensor is a combination of discrete elements of multiple single-axis magnetic switch sensor units or a single chip element integrating multiple single-axis magnetic switch sensor units; each of the single-axis magnetic switch sensor units is an X-, Y- or Z-axis magnetic switch sensor.

The single-axis linear magnetoresistive sensor is located in a single component working area corresponding to the corresponding single-axis linear magnetoresistive sensor. The two-axis or three-axis linear magnetoresistive sensor is located in an intersection of single-axis working areas corresponding to each of the single-axis linear magnetoresistive sensor units, and may also be located in a union of the single-axis working areas. When the two-axis or three-axis linear magnetoresistive sensor is located in the intersection, multiple single-axis linear magnetoresistive sensors transmit audio signals at the same time, and thus output audio signals are the sum of the audio signals of each of the linear magnetoresistive sensors; when the two-axis or three-axis linear magnetoresistive sensor is located in the union, the control circuit judges whether each of the single-axis linear magnetoresistive sensors is in the single-axis working areas or not and turns on the linear magnetoresistive sensors in the single-axis working areas, so that the working range of the measurement plane can be expanded.

In order to simplify the description about the circuit structure of the audio pickup system of the two-axis or three-axis linear magnetoresistive sensor, in FIG. 58 and FIG. 59, an audio pickup circuit and a control circuit are divided into two block structures, wherein two block diagrams corresponding to FIG. 58 are 1300 and 1350, and two block diagrams corresponding to FIG. 59 are 1400 and 1350, wherein 1350 is a common part of two structures, in addition, the corresponding controller, the pulse power/DC power of the single-axis linear magnetoresistive sensor, the power of the AC prepositive/differential signal amplifier, and the power of the prepositive/summing amplifier are also common parts.

FIG. 63 is a view of input and output of logic signals of the controller of the single-axis linear magnetoresistive sensor audio pickup corresponding to FIG. 58 or 59. The input end of the controller is 1218, the output ends are 1219, 1220, 1221, 1222 and 1223, when 1218 is 0, that is, the control circuit monitors that the single-axis linear magnetoresistive sensor is not in a linear working area, 1220 is 1 at this point, that is, it is still pulsed power supply, and at this point, 1221, 1222, 1223 and 1219 are all 0, the power circuit of the AC prepositive/differential amplifier, the power of the prepositive/differential amplifier and the power of the signal processing circuit are all turned off; on the contrary, when 1218 is 1, that is, the control circuit monitors that the single-axis linear magnetoresistive sensor is in the linear working area, at this point, 1220 is 0, that is, it is switched to DC power supply at this point, 1221, 1222, 1223 and 1219 are all 1 at this point, and the power circuit of the AC prepositive/differential amplifier, the power of the prepositive/differential amplifier and the power of the signal processing circuit 1708, 1710 are all turned on at this point, and audio signals are output. The input end of the controller of the audio pickup system of the single-axis linear magnetoresistive sensor has two combinations, and the output end has two bits and also has two combinations.

Embodiment 10

Figure 61:
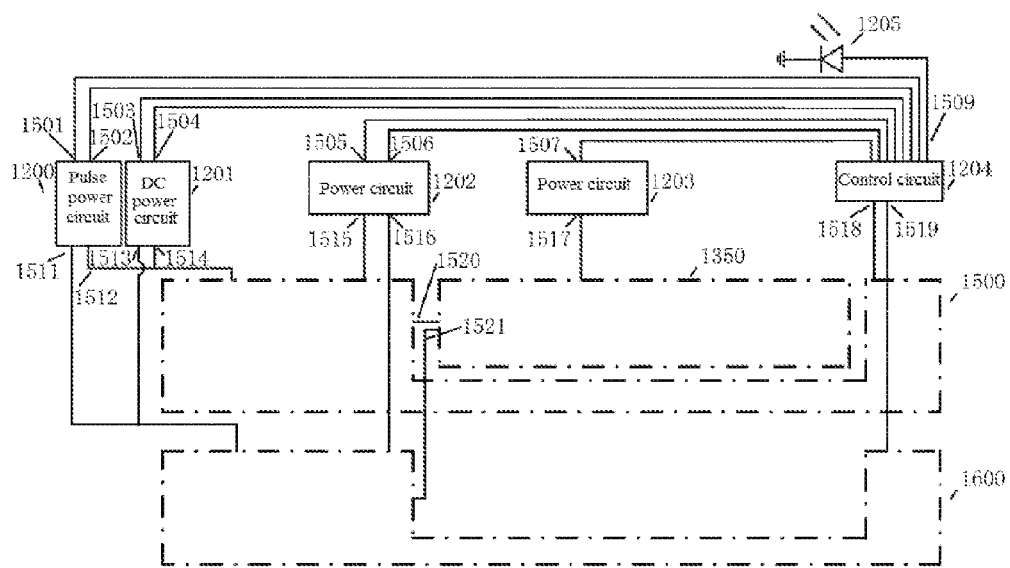
FIGS. 61-62 are respectively profiles of audio pickup systems of two-axis and three-axis linear magnetoresistive sensors.
Figure 62:
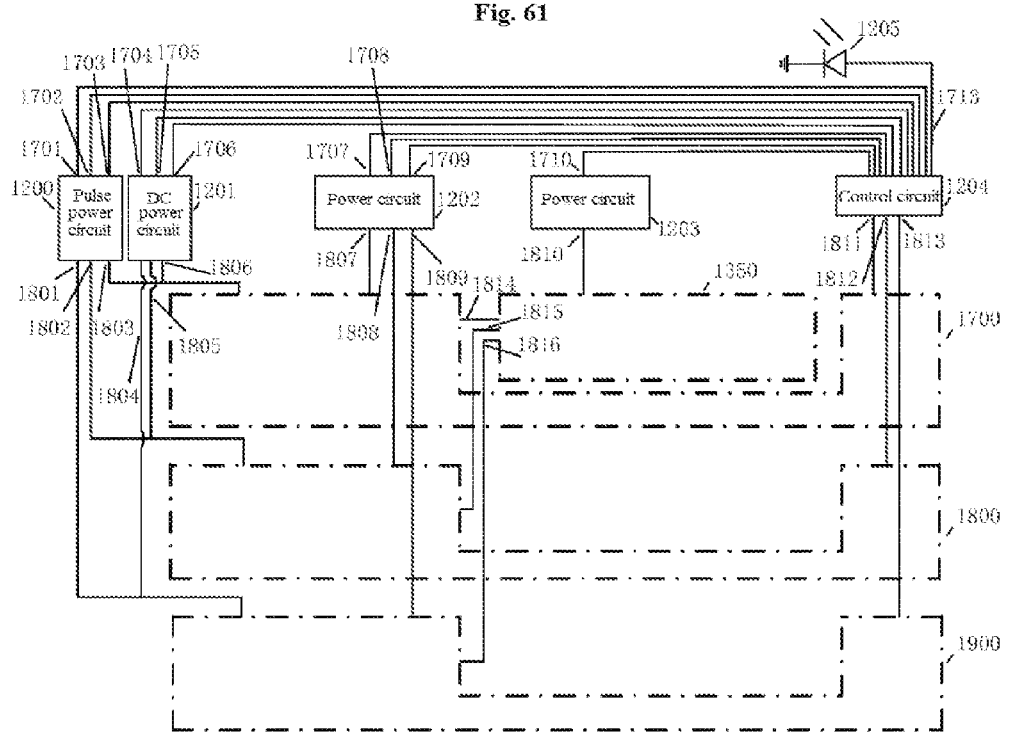

By means of the block structures shown in FIG. 58 and FIG. 59, FIG. 61 is a view of an audio pickup system of a corresponding two-axis linear magnetoresistive sensor. In addition to peripheral circuits, for example, a pulse power circuit 1200, a DC power circuit 1201, an AC prepositive/differential amplifier power circuit 1202, a prepositive/summing amplifier power circuit 1203 and a controller 1204, three parts: a block diagram 1350 and block diagrams 1500 and 1600, are further included, wherein 1500 and 1600 represent the audio pickup circuit and the control circuit of two single-axis linear magnetoresistive sensors corresponding to the two-axis linear magnetoresistive sensor respectively. According to the block structures in FIG. 58 and FIGS. 59, 1500 and 1600 may have the structure of 1300 or 1400, and output signal ends 1520 and 1521 of the AC prepositive/differential amplifier corresponding to 1500 and 1600 are connected with the summing amplifier 1209 in 1350; for the two-axis linear magnetoresistive sensor, it is necessary to use the summing amplifier 1209 to calculate the sum of output signals of the single-axis linear magnetoresistive sensors 1500 and 1600 respectively. In addition, two logic signals generated by the control circuits in 1500 and 1600 are input to the input end of the controller respectively, control signals output by the controller respectively control switching of DC power/pulse power of the single-axis linear magnetoresistive sensors corresponding to 1500 and 1600 and turn-on and turn-off of the power of the AC prepositive/differential amplifier and the power of the summing amplifier and the signal processing circuit.

FIG. 64 is a view of input and output logic signals of a controller of the two-axis linear magnetoresistive sensor audio pickup corresponding to FIG. 60. Input ends of the control circuit are 1518 and 1519, output ends of the control circuit are 1501, 1502, 1503, 1504, 1505, 1506, 1507 and 1509, when the input ends 1518 and 1519 have two bits and four combinations, the output ends have five bits and four combinations.

Embodiment 11

FIG. 61 is a view of an audio pickup system of the corresponding three-axis linear magnetoresistive sensor, which is also represented with the block structures corresponding to FIG. 58 and FIGS. 59, 1700, 1800 and 1900 respectively represent block diagrams of an audio pickup circuit and a control circuit corresponding to each single-axis linear magnetoresistive sensor, 1700, 1800 and 1900 may employ one of the block diagrams of 1300 and 1400, which may employ a DC output control manner and may also employ a magnetic switch control manner, the input end of the AC prepositive/differential amplifier in the audio pickup circuit of each single-axis linear magnetoresistive sensor in 1700, 1800 and 1900 is connected with the summing amplifier in 1350, and outputs audio signals via the signal processing circuit, three logic signals in 1700, 1800 and 1900 which monitor whether each single-axis linear magnetoresistive sensor works in a linear area or not are respectively input to the input end of the controller 1209, and output control signals of the controller 1209 respectively control switching of DC power/pulse power of the single-axis linear magnetoresistive sensors in 1700, 1800 and 1900 and turn-on and turn-off of the power of the corresponding AC prepositive/differential amplifier and the power of the summing amplifier and the signal processing circuit.

FIG. 65 is a view of input and output of logic signals of a controller of the three-axis linear magnetoresistive sensor audio pickup corresponding to FIG. 61. Input ends of the controller are 1811, 1812 and 1813, output ends of the controller are 1701, 1702, 1703, 1704, 1705, 1706, 1707, 1708, 1709, 1710 and 1713. The input ends have a total of eight combinations, and the output ends have seven bits and eight combinations.

To sum up, the present invention provides a magnetoresistive audio pickup, for converting an electromagnetic signal of a speaker to an audio signal, the speaker having a measurement plane above a voice coil surface, and the measurement plane having a single component working area thereon; the single component working area being an intersection formed by a linear magnetic field measurement area, an AC magnetic field measurement area and a SNR measurement area on the measurement plane, wherein the magnetoresistive audio pickup includes an audio pickup circuit including at least one linear magnetoresistive sensor, a coupling capacitor, an AC amplifier, an amplifier and a signal processing circuit; the linear magnetoresistive sensor includes at least one single-axis linear magnetoresistive sensor unit sensing signals from the linear magnetic field measurement area.

It should be noted that, when each of the single-axis linear magnetoresistive sensor units is located in an AC magnetic field non-measurement area on the linear magnetic field measurement area of the measurement plane, no related signals can be measured, and thus no signals will be output at this point.

Preferably, each of the single-axis linear magnetoresistive sensor units has a power input end and a signal output end separately, the signal output end of each of the single-axis linear magnetoresistive sensor units is connected to the AC amplifier via the coupling capacitor, respectively, to output AC signals, and then is connected to the amplifier to combine these signals into one signal, which is then output as an audio signal via the signal processing circuit.

Preferably, a linear magnetic field measurement area control circuit for detecting whether each of the single-axis linear magnetoresistive sensor units is located on the measurement plane or not is further included, the control circuit being a magnetic switch type control circuit or a DC output type control circuit or both.

Preferably, the magnetic switch type control circuit includes a magnetic switch sensor having at least one single-axis magnetic switch sensor unit, a comparator and a controller, the single-axis magnetic switch sensor units and the detected single-axis linear magnetoresistive sensor units have the same directions of sensitive axes; the DC output type control circuit includes a filter, a prepositive/differential amplifier, a comparator and a controller, the signal output end of each of the detected single-axis linear magnetoresistive sensor units is connected to the amplifier via the filter to obtain a DC output signal, the DC output signal is compared with the reference voltage of the comparator, to obtain a comparison signal, and the comparator inputs the comparison signal into the controller, in order that the controller controls the audio pickup circuit according to the comparison signal.

Preferably, the control circuit is further used for outputting multiple control signals to respectively control the detected single-axis linear magnetoresistive sensor unit to switch to DC power supply or pulsed power supply, and to turn on or turn off any one or more of the power of the AC amplifier, the power of the amplifier, the power of the signal processing unit and magnetically labeled signals.

The invention claimed is:

1. A magnetoresistive audio pickup for converting an electromagnetic signal of a speaker to an audio signal, the speaker having a measurement plane above a voice coil surface of the speaker, and the measurement plane having a single component working area thereon; the single component working area being an intersection formed by a linear magnetic field measurement area, an AC magnetic field measurement area and a SNR measurement area on the measurement plane, the magnetoresistive audio pickup comprising:
one or more audio pickup circuits and a control circuit, wherein each of the one or more audio pickup circuits includes a linear magnetoresistive sensor, a coupling capacitor, and an AC amplifier, and the control circuit includes an amplifier and a signal processing circuit, the linear magnetoresistive sensor of each of the one or more audio pickup circuits including one or more single-axis linear magnetoresistive sensor units to sense the electromagnetic signal of the speaker from the single component working area, the linear magnetoresistive sensor of each of the one or more audio pickup circuits having a power input end and a signal output end, wherein the signal output end is connected to the AC amplifier via the coupling capacitor to output an AC signal from the AC amplifier to the amplifier of the control circuit, wherein the control circuit is configured to combine the AC signals from each of the AC amplifiers of the one or more audio pickup circuits into one signal that is outputted as the audio signal from the signal processing circuit of the control circuit.

2. The magnetoresistive audio pickup according to claim 1, further including a controller, wherein each of the one or more audio pickup circuits further includes a linear magnetic field measurement area control circuit for use with the controller to detect whether each of the one or more single-axis linear magnetoresistive sensor units is located on the single component working area of the measurement plane, the linear magnetic field measurement area control circuit being a magnetic switch type control circuit or a DC output type control circuit or both.

3. The magnetoresistive audio pickup according to claim 2, wherein:
when the linear magnetic field measurement area control circuit is the magnetic switch type control circuit, the magnetic switch type control circuit includes a magnetic switch sensor having one or more single-axis magnetic switch sensor units and a comparator, the one or more single-axis magnetic switch sensor units and the one or more single-axis linear magnetoresistive sensor units detected by the one or more single-axis magnetic switch sensor units and located on the single component working area of the measurement plane have the same directions of sensitive axes, respectively, for detecting magnetic fields caused by the electromagnetic signal of the speaker, a signal output end of the one or more single-axis magnetic switch sensor units is connected to the comparator, and the comparator compares a signal from the one or more single-axis linear magnetoresistive sensor units detected by the one or more single-axis magnetic switch sensor units with a reference voltage stored by the comparator to obtain a comparison signal, and outputs the comparison signal into the controller, in order that the controller controls the one or more audio pickup circuit: according to the comparison signal; or
when the linear magnetic field measurement area control circuit is the DC output type control circuit, the DC output type control circuit comprises a filter, a prepositive/differential amplifier and a comparator, the signal output end of the one or more single-axis linear magnetoresistive sensor units is connected to the amplifier via the filter to obtain a DC output signal, the DC output signal is compared with the reference voltage stored by the comparator to obtain a comparison signal, and the comparator outputs the comparison signal into the controller, in order that the controller controls the one or more audio pickup circuits according to the comparison signal.

4. The magnetoresistive audio pickup according to claim 3, wherein the magnetic switch sensor is a combination of discrete elements of at least two single-axis magnetic switch sensor units or a single chip element integrated with the at least two single-axis magnetic switch sensor units.

5. The magnetoresistive audio pickup according to claim 3, wherein each of the one or more single-axis magnetic switch sensor units is an X-, Y- or Z-axis magnetic switch sensor.

6. The magnetoresistive audio pickup according to claim 3, wherein each of the one or more single-axis switch sensor units is an all-pole type magnetic switch sensor.

7. The magnetoresistive audio pickup according to claim 3, wherein when the linear magnetic field measurement area control circuit is the DC output type control circuit, a half-bridge structure includes the two single-axis linear magnetoresistive sensor units of the one or more single-axis linear magnetoresistive sensor units and the signal output end of the half-bridge structure is connected to the prepositive/differential amplifier via the filter; or a full-bridge structure includes the four single-axis linear magnetoresistive sensor units of the one or more single-axis linear magnetoresistive sensor units, and two signal output ends of the full-bridge structure are connected to the prepositive/differential amplifier via the filter, respectively.

8. The magnetoresistive audio pickup according to claim 7, wherein upper and lower values of linear magnetic fields and upper and lower values of saturation magnetic fields measured by each of the one or more single-axis linear magnetoresistive sensor units are values of operating magnetic fields and restoring the linear magnetic fields measured by each of the one or more single-axis switch sensor units and values of reference signals of a comparator of a DC voltage type control circuit, respectively.

9. The magnetoresistive audio pickup according to claim 2, wherein the linear magnetic field measurement area control circuit is also used for outputting multiple control signals to respectively control the detected and located one or more single-axis linear magnetoresistive sensor units to switch between a DC power supply and a pulsed power supply for providing power supply to the power input end, and to turn on or turn off one or more powers of the AC amplifiers of one of one or more audio pickup circuits, a power of the amplifier of the control circuit, a power of the signal processing circuit of the control circuit, and magnetically labeled signals.

10. The magnetoresistive audio pickup according to claim 1, wherein the at least one linear magnetoresistive sensor of the one or more linear magnetoresistive sensor is a combination of discrete elements of at least two single-axis linear magnetoresistive sensor units of the one or more single-axis linear magnetoresistive sensor units or a single chip element integrated with the at least two single-axis linear magnetoresistive sensor units.

11. The magnetoresistive audio pickup according to claim 1, wherein each of the one or more single-axis linear magnetoresistive sensor units is an X-, Y- or Z-axis sensor.

12. The magnetoresistive audio pickup according to claim 1, wherein the one or more single-axis linear magnetoresistive sensor units form a half-bridge structure, and the signal output end of the one or more single-axis linear magnetoresistive sensor units formed in the half-bridge structure is further connected to a prepositive AC amplifier via the coupling capacitor, or the one or more single-axis linear magnetoresistive sensor units form a full-bridge structure, and two signal output ends of the one or more single-axis linear magnetoresistive sensor units as the signal output end from the full-bridge structure are connected to a differential AC amplifier via two coupling capacitors, respectively.

13. The magnetoresistive audio pickup according to claim 1, wherein each of the one or more single-axis linear magnetoresistive sensor units for each of the one or more audio pickup circuits provides a union of single-axis working areas, and the union of the single-axis working areas includes at least one single-axis linear magnetoresistive sensor, two-axis and three-axis linear magnetoresistive sensors.

14. The magnetoresistive audio pickup according to claim 1, wherein the linear magnetoresistive sensor is one of AMR, Hall, GMR and TMR sensor.

15. The magnetoresistive audio pickup according to claim 14, wherein the measurement plane is at a distance in a range of 0 mm to 10 mm from the voice coil surface of the speaker.

16. The magnetoresistive audio pickup according to claim 1, wherein each of the one or more single-axis linear magnetoresistive sensor units has a sensitive axis in a direction perpendicular to or parallel to the measurement plane.

17. The magnetoresistive audio pickup according to claim 1, wherein the linear magnetoresistive sensor is located on the measurement plane parallel to the voice coil surface of the speaker, and at least one of the one or more single-axis linear magnetoresistive sensor units is located in the linear magnetic field measurement area on the measurement plane.

18. The magnetoresistive audio pickup according to claim 1, wherein the magnetoresistive audio pickup is suitable for speakers having circular, racetrack-shaped or rectangular voice coils.

19. The magnetoresistive audio pickup according to claim 1, wherein the magnetoresistive audio pickup is suitable for external magnetic or internal magnetic speakers.

* * * * *

UNITED STATES PATENT AND TRADEMARK OFFICE
CERTIFICATE OF CORRECTION

PATENT NO. : 10,187,731 B2
APPLICATION NO. : 15/127663
DATED : January 22, 2019
INVENTOR(S) : Zhou et al.

Page 1 of 1

It is certified that error appears in the above-identified patent and that said Letters Patent is hereby corrected as shown below:

On the Title Page

Item (71), in "Applicant", in Column 1, Line 2, delete "Zhangjiagang" and insert --Zhangjiagang, Jiangsu-- therefor In the Claims In Column 18, Line 48, in Claim 3, delete "circuit:" and insert --circuits-- therefor In Column 19, Line 39, in Claim 9, delete "of one of one" and insert --of one-- therefor In Column 20, Line 10, in Claim 12, delete "capacitor," and insert --capacitor;-- therefor Signed and Sealed this
Eighth Day of December, 2020

Andrei Iancu
*Director of the United States Patent and Trademark Office*